US012761740B2

(12) United States Patent
Liu et al.

(10) Patent No.: US 12,761,740 B2
(45) Date of Patent: Oct. 13, 2026

(54) PRESSING KEY DETECTION SYSTEM, DEVICE, METHOD, AND STORAGE MEDIUM

(71) Applicant: Chipsemi Semiconductor (NingBo) Co., Ltd., Ningbo (CN)

(72) Inventors: Kejia Liu, Ningbo (CN); Yaoguo Zhang, Ningbo (CN); Guofan Cheng, Ningbo (CN); Fasi Sun, Ningbo (CN); Bo Nie, Ningbo (CN)

(73) Assignee: Chipsemi Semiconductor (NingBo) Co., Ltd., Zhejiang (CN)

( * ) Notice: Subject to any disclaimer, the term of this patent is extended or adjusted under 35 U.S.C. 154(b) by 0 days.

(21) Appl. No.: 19/460,281

(22) Filed: Jan. 26, 2026

(65) Prior Publication Data

US 2026/0153940 A1 Jun. 4, 2026

Related U.S. Application Data

(63) Continuation of application No. PCT/CN2025/105903, filed on Jun. 30, 2025.

(30) Foreign Application Priority Data

Sep. 3, 2024 (CN) ........................ 202411230253.8

(51) Int. Cl.
*G06F 3/02* (2006.01)
*H03K 17/975* (2006.01)

(52) U.S. Cl.
CPC ......... *G06F 3/0202* (2013.01); *H03K 17/975* (2013.01)

(58) Field of Classification Search
CPC ....... G06F 3/02; G06F 3/0202; H03K 17/965; H03K 17/975
See application file for complete search history.

(56) References Cited

U.S. PATENT DOCUMENTS 9,568,524 B2 * 2/2017 Hanssen .............. H03K 17/955
10,715,141 B2 * 7/2020 Lee .................... H03K 17/9622
(Continued)

FOREIGN PATENT DOCUMENTS

CN 104777913 A 7/2015
CN 116382995 A 7/2023
(Continued)

OTHER PUBLICATIONS

Chipsemi Semiconductor (NingBo) Co., Ltd., Chinese First Examination Report with English Translation, CN202411230253.8, Dec. 13, 2024, 13 pgs.

*Primary Examiner* — Franklin D Balseca
(74) *Attorney, Agent, or Firm* — USCH Law, PC

(57) ABSTRACT

This application provides a pressing key detection system, device, method, and storage medium. The system includes at least one key, a driving circuit, and a detection circuit. Each key includes a base and a movement assembly. The movement assembly extends through a top surface of the base and reciprocates perpendicular to the top surface. The movement assembly includes a core shaft, and two conductor plates fixed relative to the core shaft. The base includes a casing, and a main electrode plate and a secondary electrode plate fixed opposite to the casing. The two conductor plates are respectively arranged opposite to the main electrode plate and the secondary electrode plate. The driving circuit is connected to the secondary electrode plate, and the detection circuit is connected to the main electrode plate. The driving circuit drives the secondary electrode plate to operate. This key arrangement improves accuracy of key displacement detection.

12 Claims, 12 Drawing Sheets

(56) References Cited

U.S. PATENT DOCUMENTS

| | | | |
|---|---|---|---|
| 11,177,093 | B1 | 11/2021 | Jain |
| 2015/0061902 | A1 | 3/2015 | Casparian et al. |
| 2015/0193008 | A1 | 7/2015 | Bolender |
| 2021/0294430 | A1 | 9/2021 | Smith et al. |

FOREIGN PATENT DOCUMENTS

| | | | | | |
|---|---|---|---|---|---|
| CN | 116743147 | A | | 9/2023 | |
| CN | 117055742 | A | | 11/2023 | |
| CN | 117097347 | A | | 11/2023 | |
| CN | 220065495 | U | | 11/2023 | |
| CN | 117457427 | A | | 1/2024 | |
| CN | 118098855 | A | * | 5/2024 | ........... H03K 17/975 |
| CN | 118764034 | A | | 10/2024 | |
| JP | 2014086058 | A | | 5/2014 | |
| WO | WO-2021176993 | A1 | * | 9/2021 | ............... G06F 3/02 |

* cited by examiner

PRESSING KEY DETECTION SYSTEM, DEVICE, METHOD, AND STORAGE MEDIUM

CROSS REFERENCE TO RELATED APPLICATIONS

This application is a continuation of PCT Patent Application No. PCT/CN2025/105903, entitled "PRESSING KEY DETECTION SYSTEM, DEVICE, METHOD, AND STORAGE MEDIUM" filed on Jun. 30, 2025, which claims priority to Chinese Patent Application No. 202411230253.8, filed on Sep. 3, 2024, each of which is incorporated by reference herein in its entirety.

TECHNICAL FIELD

The present application relates to the technical field of key pressing, and in particular to a pressing key detection system, device, method, and a computer readable storage medium.

BACKGROUND

Currently, electronic devices with key types are widely used in production and daily life, such as keyboards, computers, and other devices. Taking keyboard keys as an example, conventional keyboard keys can only detect on/off states. After pressing a key on a conventional silicone keyboard, the circuit is turned on to achieve the detection function, but it can only recognize on/off states and cannot recognize intermediate processes.

To detect the intermediate state of key presses, a novel keyboard technology has emerged based on conventional keyboards: the magnetic switch keyboard. Small magnets are embedded at the base of the key stem, while Hall sensors are integrated onto main circuit board of the keyboard. When a magnetic switch key is pressed, the distance between the key and the Hall sensor changes. The Hall sensor detects variations in magnetic field strength, enabling the measurement of key travel displacement through magnetic field detection.

However, each key on a magnetic switch keyboard requires a dedicated Hall chip beneath it, resulting in high costs and significant power consumption. These keys are also susceptible to interference from external magnetic fields, temperature variations, and other environmental factors, leading to low accuracy in detecting key displacement.

SUMMARY

The present disclosure of this application provides a pressing key detection system, device, method, and a computer readable storage medium, so as to balance the accuracy and cost of detecting key displacement.

In order to solve the above technical problem, in one aspect, an embodiment of the present disclosure provide a key pressing detection system including at least one key, a driving circuit, a detection circuit, and a processing unit. Each of the at least one key includes a base and a movement assembly, the movement assembly extends through a top surface of the base, and the movement assembly is configured to reciprocate perpendicular to the top surface. The movement assembly includes a core shaft, and two conductor plates opposite to the core shaft and fixed relative to the core shaft. The base includes a casing, a main electrode plate, and a secondary electrode plate both fixed relative positions to the casing, the two conductor plates are arranged opposite to the main electrode plate and the secondary electrode plate. The secondary electrode plate, the two conductor plates and the main electrode plate forms a target capacitor, and the target capacitor is configured to generate capacitance signals that change in response to the core shaft reciprocates. The driving circuit is connected to the secondary electrode plate, and the detection circuit is connected to the main electrode plate. The driving circuit is configured to drive the secondary electrode plate, and the detection circuit is configured to detect the capacitance signals of the target capacitor. The processing unit is connected to the detection circuit and configured to determine a displacement of the at least one key according to the capacitance signals of the target capacitor.

In a second aspect, an embodiment of the present disclosure further provides an electronic device including: the key pressing detection system as described above.

In a third aspect, an embodiment of the present disclosure further provides a key pressing detection method, which is applied to the key pressing detection system as described above. The method includes: detecting the capacitance signals generated by the target capacitor of the at least one key; and determining a pressing status of the at least one key based on changes in the capacitance signals.

In a fourth aspect, an embodiment of the present disclosure further provides a non-transitory computer readable storage medium stored with a computer program, where the computer program is executed by a processor to implement the key pressing detection method as described above.

In some embodiments, the key pressing detection system includes a plurality of keys that are arranged in matrix having N rows and M columns, where N and M are integers greater than 0, the driving circuit includes N driving pins, and the detection circuit includes M detection pins. The secondary electrode plate of each row of the keys is connected to a respective driving pin of the driving circuit. The main electrode plate of each column of the keys is connected to a respective detection pin of the detection circuit.

In some embodiments, the main electrode plate includes a first electrode plate and a second electrode plate; the secondary electrode plate, the two conductor plates and the first electrode plate form a first capacitor, and the secondary electrode plate, the two conductor plates and the second electrode plate form a second capacitor. The detection circuit is connected to the first electrode plate and the second electrode plate of the main electrode plate, and the detection circuit is configured to detect a capacitance signal of the first capacitor and a capacitance signal of the second capacitor. The capacitance signal of the first capacitor and the capacitance signal of the second capacitor are changed when the core shaft reciprocates.

In some embodiments, the main electrode plate includes two first electrode plates symmetrically arranged on both sides of the second electrode plate; one of the two first electrode plates is separated from the second electrode plate by a first gap, and another of the first electrode plates is separated from the second electrode plate by a second gap. Each of an extension direction of the first gap and an extension direction of the second gap differs from a reciprocating motion direction of the core shaft.

In some embodiments, the two first electrode plates and the second electrode plate form an electrode plate assembly, and the main electrode plate includes a plurality of electrode plate assemblies. The plurality of electrode plate assemblies are arranged on an inner side wall of the casing, and are arranged along a direction perpendicular to the reciprocating motion direction. In two adjacent electrode plate assemblies, the first electrode plate of a respective electrode plate assembly is arranged adjacent to and is integrated with a first electrode plate of a corresponding electrode plate assembly adjacent to the respective electrode plate assembly.

In some embodiments, the key pressing detection system includes a plurality of keys are arranged in a matrix having N rows and M columns, where N and M are integers greater than 0. The driving circuit includes N driving pins, the detection circuit includes M first detection pins, and M second detection pins. The secondary electrode plate of each row of the keys is connected to a respective driving pin of the driving circuit. The first electrode plate of the main electrode plate of each column of the keys is connected to a respective first detection pin of the detection circuit. The second electrode plate of the main electrode plate of each column of the keys is connected to a respective second detection pin of the detection circuit.

In some embodiments, each of the two conductor plates is arranged on a respective outer side wall of the core shaft, and the two conductor plates is connected to each other by wire. Each of the secondary electrode plate and the main electrode plate is arranged on a respective inner side wall of the casing, the secondary electrode plate is arranged opposite to one of the two conductor plates, and the main electrode plate is arranged opposite to the other one of the two conductor plates.

The technical solution provided in the embodiments of the present disclosure at least has the following advantages.

The key pressing detection system according to the present disclosure includes at least one key, a driving circuit, a detection circuit, and a processing unit. The two conductor plates, a secondary electrode plate, and a main electrode plate are provided in each of the at least one key. The two conductor plates are respectively arranged opposite to the secondary electrode plate and the main electrode plate. The two conductor plates is fixed opposite to the core shaft, and the secondary electrode plate and the main electrode plate are fixed opposite to the casing. The driving circuit is connected to the secondary electrode plate, and the detection circuit is connected to the main electrode plate. When the at least one key is pressed or released, the core shaft drives the two conductor plates to move downwards or upwards. The relative area between the two conductor plates and the secondary electrode plate, and the relative area between the two conductor plates and the main electrode plate are changed, causing the capacitance signals of the target capacitor formed by the secondary electrode plate, the two conductor plates, and the main electrode plate to change. The processing unit can determine the movement distance of the at least one key according to the capacitance signals of the target capacitor, identify the intermediate position of the at least one key, and improve the accuracy of detection of displacement of the at least one key.

BRIEF DESCRIPTION OF THE DRAWINGS

One or more embodiments are illustrated by corresponding figures in the accompanying drawings, which do not constitute limitations on the embodiments. Elements with the same reference numbers in the accompanying drawings are represented as similar elements, and unless otherwise specified, the figures in the accompanying drawings do not constitute scale limitations.

DETAILED DESCRIPTION OF EMBODIMENTS

Figure 1:
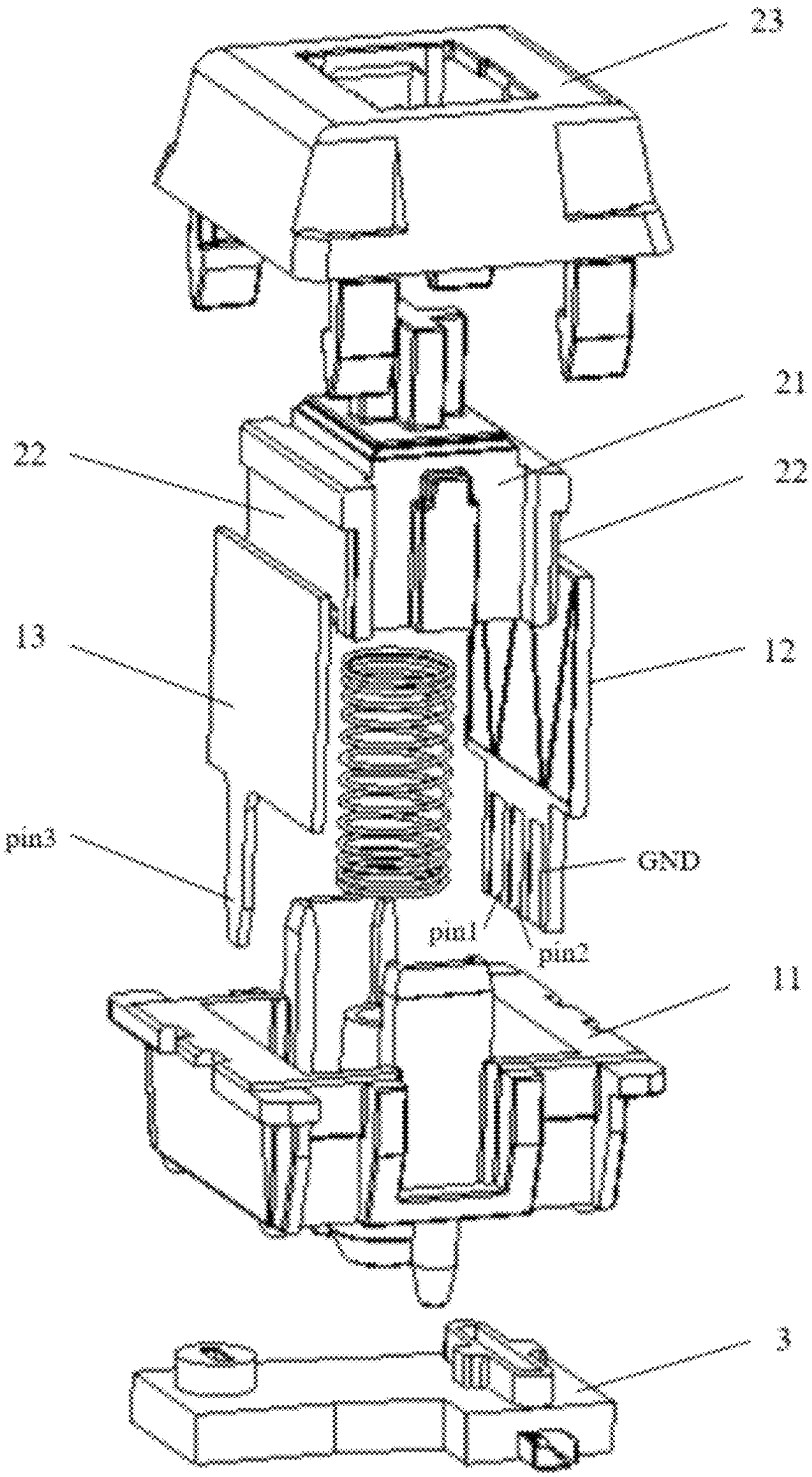
FIG. 1 is a schematic diagram of an explosion structure of a capacitive sensing key according to an embodiment of the present disclosure.

To address the problems in the related technologies that the detection accuracy of the key displacement amount of the magnetic switch key is low and the hardware cost is high, some embodiments of the present disclosure relate to a key pressing detection system including at least one key, a driving circuit, a detection circuit, and a processing unit. Each respective key of the at least one key includes a base and a movement assembly, and the movement assembly extends through a top surface of the base and reciprocates perpendicular to the top surface. The movement assembly includes a core shaft, and two conductor plates opposite to the core shaft and fixed relative to the core shaft. The base includes a casing, and a main electrode plate and a secondary electrode plate fixed relative to the casing, and the two conductor plates are respectively arranged opposite to the main electrode plate and the secondary electrode plate. The secondary electrode plate, the two conductor plates, and the main electrode plate form a target capacitor. During reciprocating movement of the core shaft, the capacitance signals of the target capacitor changes. The driving circuit is connected to the secondary electrode plate, and the detection circuit is connected to the main electrode plate. The driving circuit is configured to drive the secondary electrode plate, and the detection circuit is configured to detect the capacitance signals of the target capacitor. The processing unit is connected to the detection circuit, and is configured to determine the displacement of the at least one key based on the target capacitor.

In some embodiments, the key detection system includes at least one key, a driving circuit, and a detection circuit. At least one conductor plate, a main electrode plate, and a secondary electrode plate are provided in each of the at least one key. The two conductor plates are respectively arranged opposite to the main electrode plate and the secondary electrode plate. The two conductor plates are opposite to the core shaft and fixed relative to the core shaft, and the secondary electrode plate and the main electrode plate are fixed opposite to the casing. The driving circuit is connected to the secondary electrode plate, and the detection circuit is connected to the main electrode plate. When the at least one key is pressed or released, the core shaft drives the at least one conductor plate to move downwards or upwards. The relative area between the two conductor plates and the secondary electrode plate, as well as the relative area between the two conductor plates and the main electrode plate are changed, causing the capacitance signals of the target capacitor formed by the secondary electrode plate, the two conductor plates, and the main electrode plate to change. The processing unit can determine the movement distance of the at least one key according to the capacitance signals of the target capacitor, identify the intermediate position of the at least one key, and improve the accuracy of detection of displacement of the at least one key.

In order to clarify the purpose, technical solution, and advantages of the embodiments of the present disclosure, the following will provide a detailed explanation of each embodiment of the present disclosure in conjunction with the accompanying drawings. However, those skilled in the art will understand that many technical details have been proposed in various embodiments of the present disclosure to help readers better understand the present disclosure. However, even without these technical details and various changes and modifications based on the following embodiments, the technical solution claimed in the present disclosure can still be achieved. The division of the following embodiments is for the convenience of description and should not constitute any limitation on the specific implementation of the present disclosure. The embodiments can be combined and referenced with each other without contradiction.

Figure 2:
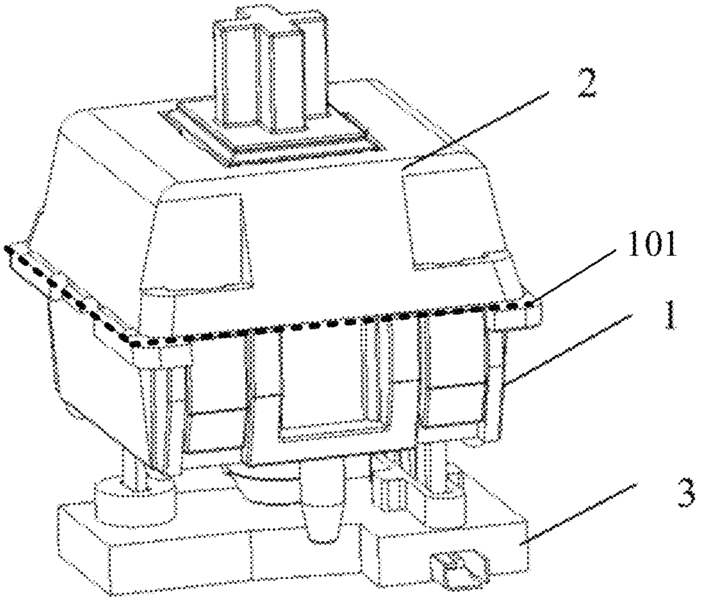
FIG. 2 is a structural diagram of a capacitive sensing key according to an embodiment of the present disclosure.

As shown in FIG. 1, which is a schematic diagram of an explosion structure of a capacitive sensing key according to some embodiments of the present disclosure. As shown in FIG. 2, which is a schematic diagram of a structure of the capacitive sensing key according to some embodiments. In the embodiments, the key detection system includes a base 1 and a movement assembly 2. The movement assembly 2 extends through a top surface 101 of the base 1 and reciprocates perpendicular to the top surface 101. The movement assembly 2 includes a core shaft 21, and at least one conductor plate 22 fixed in position relative to the core shaft 21. The base 1 includes a casing 11, a main electrode plate 12 and a secondary electrode plate 13 both fixed relative to the casing 11, and the at least one conductor plate 22 is respectively arranged opposite to the main electrode plate 12 and the secondary electrode plate 13. The secondary electrode plate 13, the at least one conductor plate 22, and the main electrode plate 12 form a target capacitor. When the core shaft 21 reciprocates, the capacitance signals of the target capacitor changes.

Specifically, the conductive pins at the lower ends of the main electrode plate 12 and the secondary electrode plate 13 pass through the casing 11 and are inserted into the corresponding interfaces of the shaft seat 3, and the conductive pins at the lower ends of the main electrode plate 12 and the secondary electrode plate 13 are respectively connected to the driving circuit through the shaft seat 3, thereby forming a capacitive loop. This facilitates the detection of the target capacitor, enabling the measurement of the key displacement. The solution is simple and reliable, the cost is low, and the hot plug function can be realized. In some embodiments, the movement assembly 2 further includes a cover plate 23, the cover plate 23 includes a hollow area, the cover plate 23 covers the core shaft 21, and the top surface of the core shaft 21 is exposed out of the surface of the cover plate 23 through the hollow area. In some embodiments, as shown in FIG. 1, there are two conductor plates 22, the two conductor plates 22 are opposite to the core shaft 21 and fixed relative to the core shaft 21, and each of the two conductor plates 22 is disposed on a respective outer side wall of the core shaft 21. The two conductor plates 22 are connected to each other by wires (not shown in FIG. 1). Each of the secondary electrode plate 13 and the main electrode plate 12 is arranged on a respective inner side wall of the casing 11, the secondary electrode plate 13 is arranged opposite to one of the conductor plate 22, and the main electrode plate 12 is arranged opposite to the other one of the conductor plate 22. Specifically, each of the two conductor plates 22 is arranged on the two outer side walls opposite to each other in the core shaft 21, and the main electrode plate 12 and the secondary electrode plate 13 are respectively arranged on the different inner side walls opposite to each other in the casing 11.

The two conductor plates 22 are connected to each other by wires. The main electrode plate 12 is set opposite to one conductor plate 22, and the secondary electrode plate 13 is opposite to the other conductor plate 22. By utilizing the jumping bridging characteristic of the two conductor plates 22 to bridge capacitance signals, the actual distance between the main electrode plate 12 and the secondary electrode plate 13 can be changed. This allows for greater flexibility in designing an electrode plate within the key, freeing the electrode plate from spatial constraints. The main electrode plate 12 and secondary electrode plate 13 can be placed in the free areas within the key, which improves the flexibility of the key design, ensures the small size of the key, and is beneficial for further reduction of the size of the key.

Figure 3:
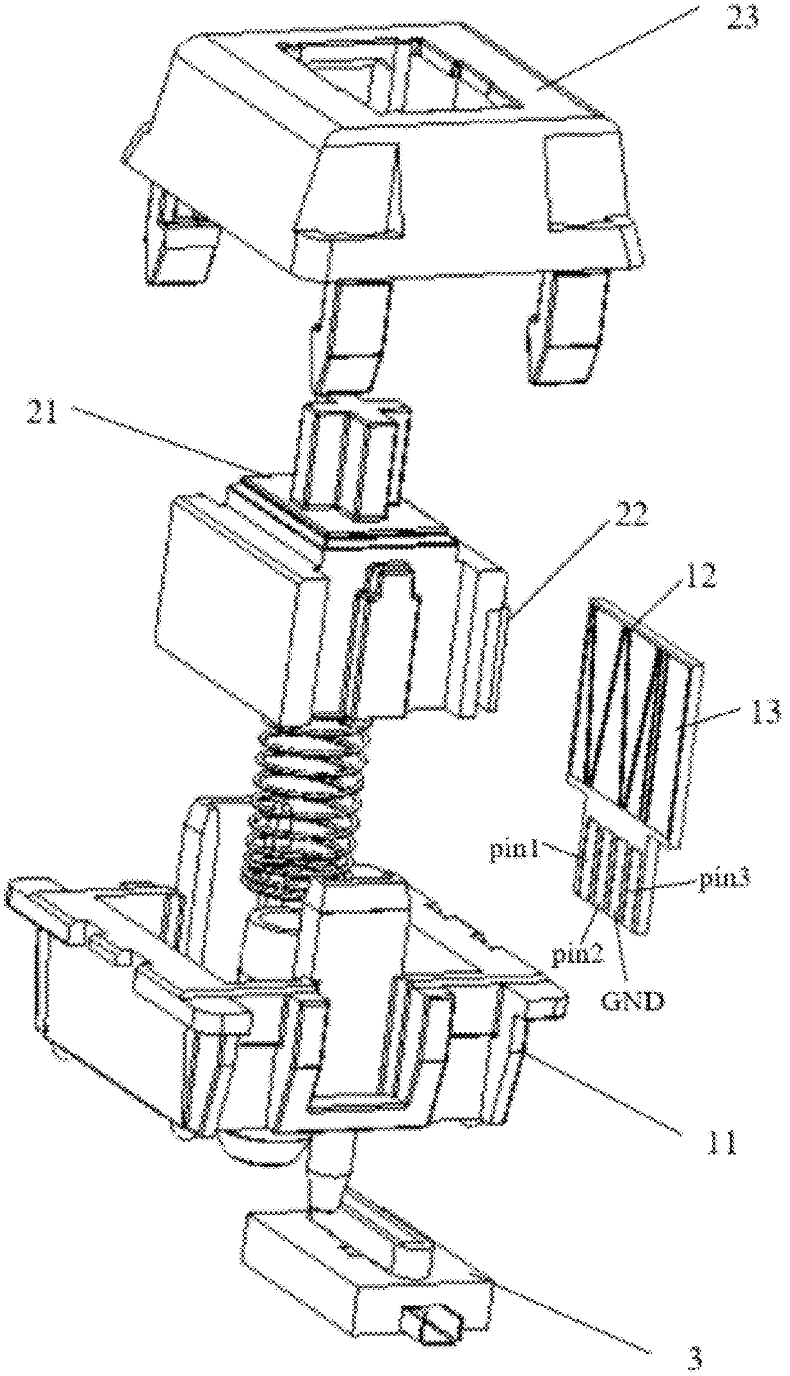
FIG. 3 is a schematic diagram of an explosion structure of a capacitive sensing key according to an embodiment of the present disclosure.

In some embodiments, the at least one conductor plate 22 is located on the outer side wall of the core shaft 21, and the main electrode plate 12 and the secondary electrode plate 13 are located on the same inner side wall of the casing 11. As shown in FIG. 3, which is a schematic diagram of the explosion structure of the capacitive sensing key according to the embodiment of the present disclosure. The at least one conductor plate 22 is disposed on the outer side wall of the core shaft 21, and the main electrode plate 12 and the secondary electrode plate 13 are arranged on the same inner side wall of the casing 11.

The at least one conductor plate 22 is set on the outer side wall of the core shaft 21, the main electrode plate 12, the secondary electrode plate 13 and the other conductor plate 22 are arranged on the same inner side wall of the casing 11. The actual distance between the main electrode plate 12 and the secondary electrode plate 13 is changed by using the jumping bridging characteristic of the at least one conductor plate 22 to bridge the capacitance signal, so that the design of the electrode plates in the key can be more flexible, the space limitation of the electrode plate can be removed, and the main electrode plate 12 and the secondary electrode plate 13 can be set in the free area in the key. The flexibility of the key setting is improved, the size of the key is ensured to be small, and the size of the key is further reduced.

The at least one conductor plate 22, the main electrode plate 12, and the secondary electrode plate 13 are provided in the at least one key. The at least one conductor plate 22 is positioned opposite to the main electrode plate 12 and the secondary electrode plate 13, and is fixed opposite to the core shaft 21. The main electrode plate 12 and the secondary electrode plate 13 are fixed opposite to the casing 11. When the key is pressed or released, the core shaft 21 drives the at least one conductor plate 22 to move downward or upward. This changes the relative area between the at least one conductor plate 22 and the main electrode plate 12, as well as the relative area between the at least one conductor plate 22 and the secondary electrode plate 13 resulting in a change in the capacitance signal of the target capacitor. The movement distance of the key can be determined based on the target capacitor changes, and the intermediate position of the key can be determined. This enables full-process detection during key presses, improving the accuracy of key displacement detection. Compared with magnetic switch solutions, the advantages of good linearity, strong anti-interference ability, and low power consumption can be achieved. Furthermore, based on the accurate determination of the displacement of the core shaft 21, trigger stroke and trigger timing of the key can be discretionarily set, thereby providing users with different tactile experiences. Additionally, multi-level triggers can be designed on an individual key to enrich the tactile experience of the individual key.

The key detection system of the embodiment further includes a driving circuit, a detection circuit and a processing unit. The driving circuit is connected to the secondary electrode plate 13, and the detection circuit is connected to the main electrode plate 12. The driving circuit is configured to drive the secondary electrode plate 13 to operate, and the detection circuit is configured to detect the target capacitor.

In some embodiments, there are a plurality of keys arranged in a matrix having N rows and M columns, where N and M are integers greater than 0. The driving circuit includes N driving pins, and the detection circuit includes M detection pins. The secondary electrode plates 13 of each row of the N rows of keys are connected to a respective driving pin of the N driving pins of the driving circuit. The main electrode plates 12 of each column of the M columns of keys are connected to a respective detection pin of the M detection pins of the detection circuit.

Figure 4:
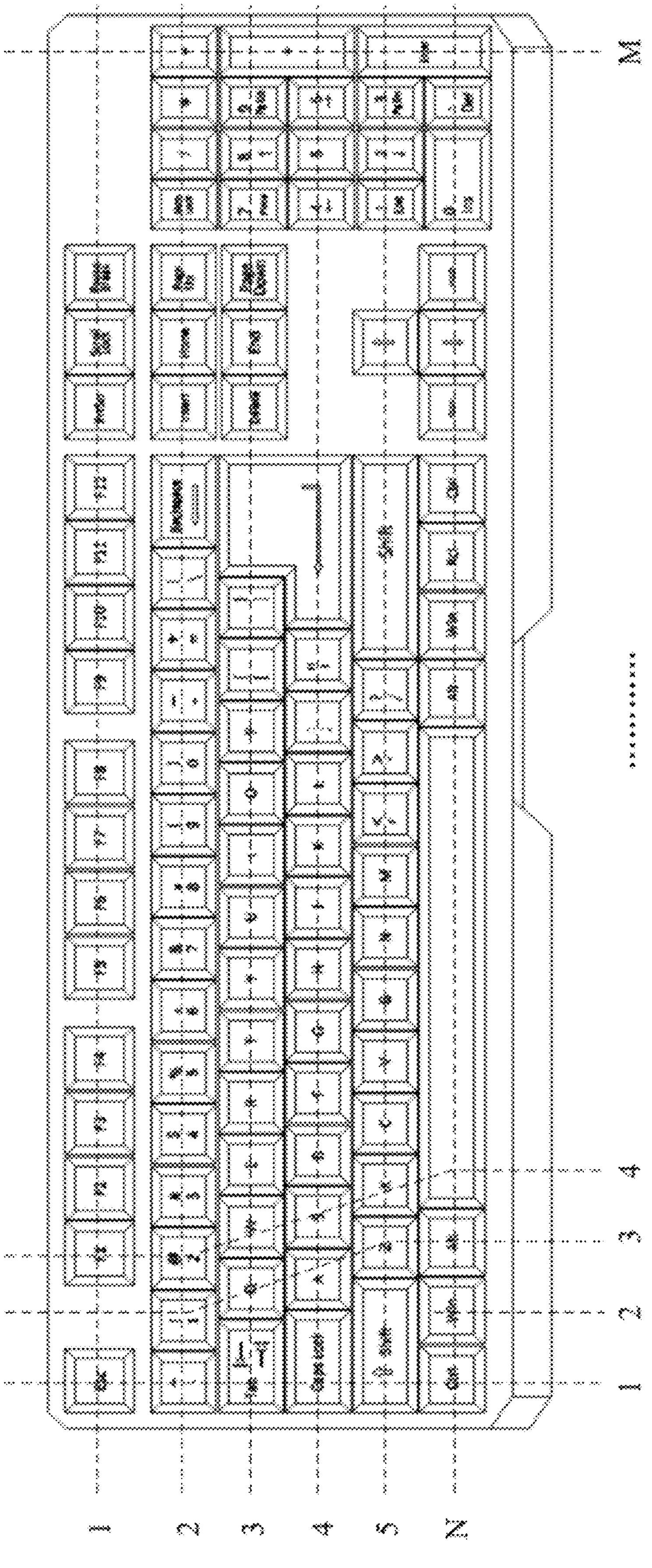
FIG. 4 is a structural diagram of a plurality of keys arranged according to an embodiment of the present disclosure.

FIG. 4 is a structural schematic diagram of the arrangement of a plurality of keys according to some embodiments of the present disclosure. As shown in FIG. 4, a keyboard depicted is used as an example for a computer keyboard and does not limit the scope of the embodiments. The number of keys in each row and column can be configured according to actual requirements, and does not impose specific limitations.

Figure 5:
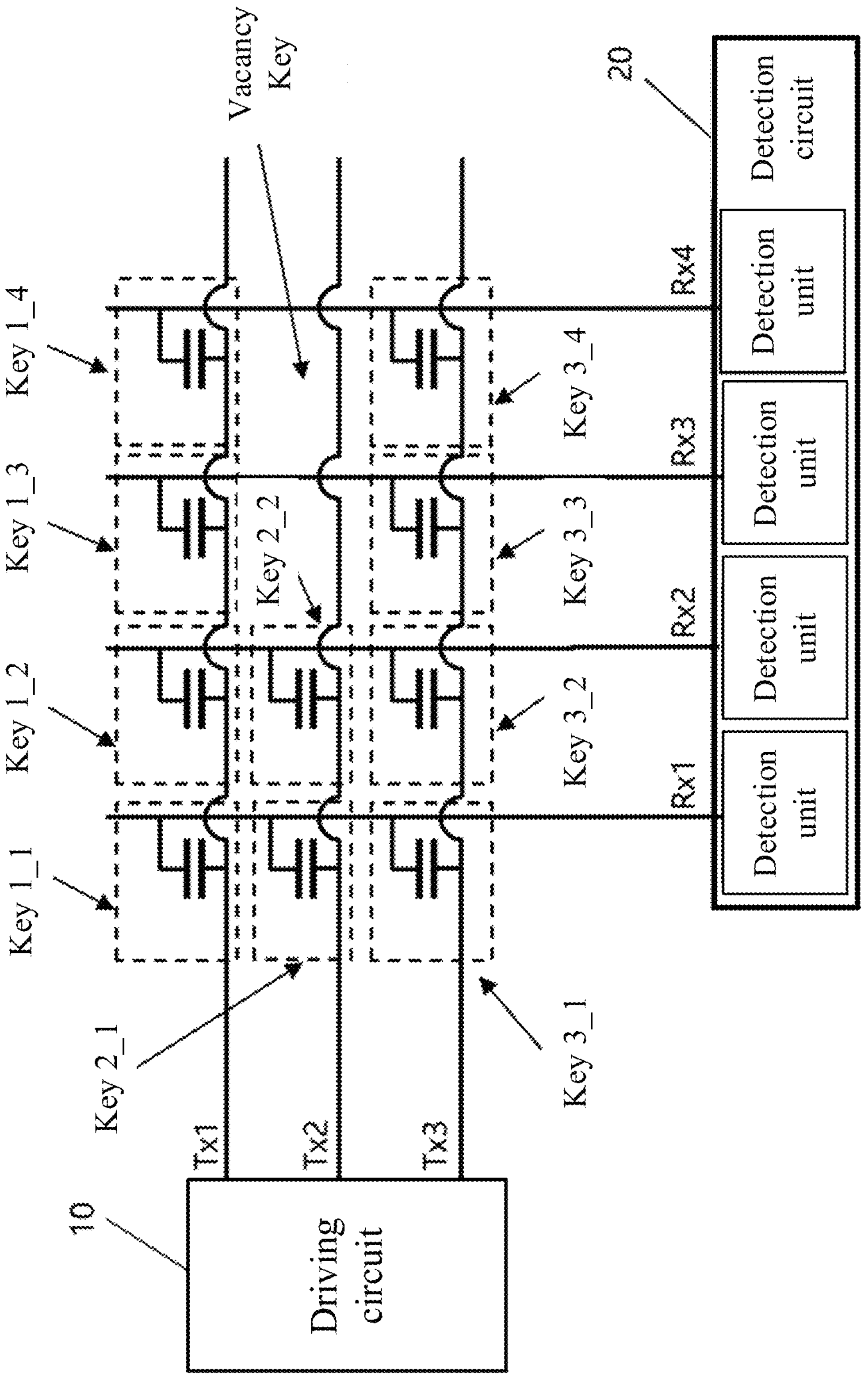
FIG. 5 is a schematic diagram of an equivalent circuit of a key pressing detection system according to an embodiment of the present disclosure.

FIG. 5 is an equivalent circuit diagram of the key detection system according to some embodiments of the present disclosure. In some embodiments, the key detection system includes a driving circuit 10, a detection circuit 20, a processing unit (not shown in FIG. 5), and a plurality of keys. The plurality of keys are arranged in an N*M matrix, the driving circuit 10 includes N driving pins, namely Tx1, Tx2, Tx3, . . . , TxN, and the detection circuit 20 includes M detection pins, namely Rx1, Rx2, Rx3, . . . , RxM. FIG. 5 illustrates an example with N=3 and M=4. To meet practical requirements, the system may include vacancy keys. However, these vacancy keys do not affect the implementation of the embodiments and still satisfy the key detection requirements.

Specifically, the dashed box in FIG. 5 represents a key, and the capacitance in the dashed box represents the target capacitance formed by the at least one conductor plate 22, the main electrode plate 12, and the secondary electrode plate 13. The keys are arranged in a row-and-column sequence. The secondary electrode plate 13 of each row of keys is connected to one driving pin of the driving circuit 10, and the main electrode plate 12 of each column of keys is connected to one detection pin of the detection circuit 20.

In some embodiments, the driving pin Tx1 of the driving circuit 10 is connected to the secondary electrode plate 13 of key 1_1, key 1_2, key 1_3, and key 1_4. The driving pin Tx2 of the driving circuit 10 is connected to the secondary electrode plate 13 of key 2_1 and key 2_2. The driving pin Tx3 of the driving circuit 10 is connected to the secondary electrode plate 13 of key 3_1, key 3_2, key 3_3, and key 3_4. The detection pin Rx1 of the detection circuit 20 is connected to the main electrode plate 12 of key 1_1, key 2_1, and key 3_1. The detection pin Rx2 of the detection circuit 20 is connected to the main electrode plate 12 of key 1_2, key 2_2, and key 3_2. The detection pin Rx3 of the detection circuit 20 is connected to the main electrode plate 12 key 1_3 and key 3_3. The detection pin Rx4 of the detection circuit 20 is connected to of the main electrode plate 12 of key 1_4, and key 3_4.

Specifically, when the driving circuit 10 drives the secondary electrode plate 13 to operate via the driving pin, the secondary electrode plate 13 can either operate simultaneously or in a time-sharing manner. Taking the time-sharing operation as an example for illustration, the driving circuit 10 sends driving signals in a time-sharing manner. When the driving circuit 10 sends the drive signal via the drive pin Tx1, the first row of key 1_1, key 1_2, key 1_3 and key 1_4 of the secondary electrode plate 13 begin to function, the detection pins Rx1, Rx2, Rx3, Rx4 of the detection circuit 20 respectively receive the capacitance signals of the target capacitor for key 1_1, key 1_2, key 1_3, and key 1_4 respectively. If key 1_1 is pressed at this moment, the capacitance signal of the target capacitor received by the detection pin Rx1 of the detection circuit 20 changes. Based on these changes, it can be determined that the key 1_1 is pressed, along with the displacement of the key press. The scenarios for key 1_2, key 1_3, and key 1_4 are similar and will not be described here. In this manner, the pressing status of all keys in the first row are obtained, thereby determining the corresponding user input. Subsequently, the driving pin Tx1 of the driving circuit 10 stops sending signals, and the driving circuit 10 transmits the driving signal via the driving pin Tx2. The detection pins Rx1 and Rx2 of the detection circuit 20 receive the target capacitors of key 2_1 and key 2_2, respectively. By detecting the capacitance values of these target capacitors, it can be further determined the pressing status of key 2_1 and key 2_2. The remaining keys follow the same logic, until the entire sweeping process is completed. It should be noted that vacancies are allowed in the overall circuit arrangement, and this does not affect the detection performance.

Specifically, each detection circuit 20 includes a plurality of detection units, where each of the detection pins is connected to a respective detection unit of the plurality of detection units, and each detection unit is used to acquire a capacitance of a target capacitor, thereby enabling detection of the capacitance signal of the target capacitor.

Specifically, the processing unit of the embodiment is connected to the detection circuit 20. The detection circuit 20 sends the obtained capacitance of the target capacitor to the processing unit. After obtaining the capacitance of the target capacitor, the processing unit calculates the obtained capacitance using the formula $C=\varepsilon S/4\pi kd$, where $\varepsilon$ is a dielectric constant, k is an electrostatic force constant, S is the area of the conductor plate 22 facing the main electrode plate 12, and d is the distance between the conductor plate 22 an d the main electrode plate 12. The displacement of the key can be obtained based on the area S of the conductor plate 22 facing the main electrode plate 12.

Specifically, the processing unit can pre-store relationship between a capacitance of each target capacitor and the key displacement in advance. After the processing unit obtains the capacitance of each target capacitor, the key displacement can be directly obtained based on the target capacitance, improving the efficiency of obtaining the key displacement.

The embodiments employ a circuit connection method that aligns the overall circuit layout with the key structure arrangement. Each row of keys shares a respective drive pin for the secondary electrode plate 13, while each column of buttons shares a respective detection pin for the main electrode plat 12. This approach not only simplifies the overall circuit complexity but also eliminates the need for individual drive and detection pins for each key, thereby reducing the overall circuit cost.

Figure 6:
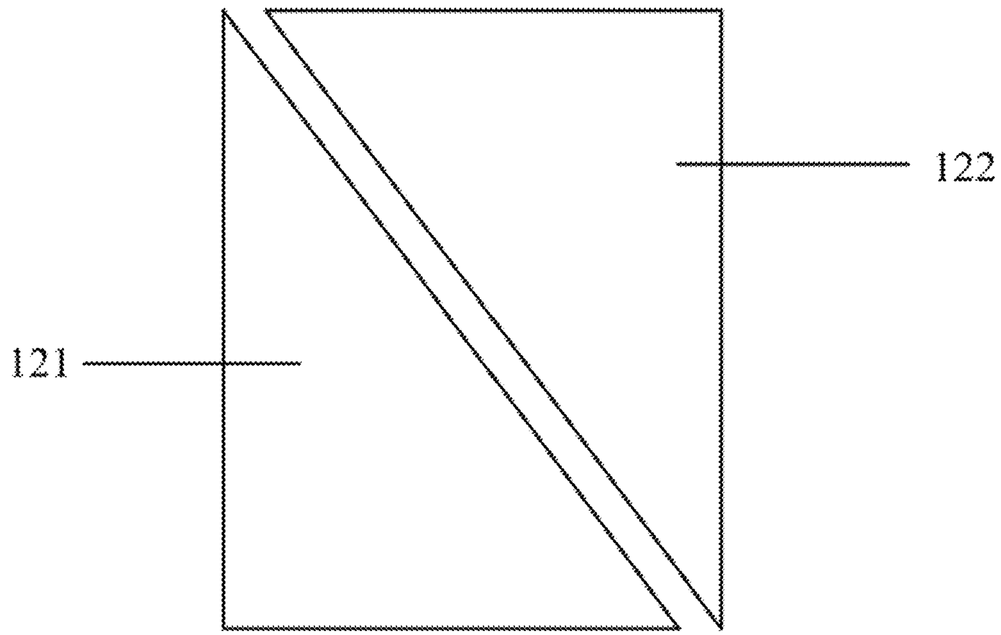
FIG. 6 is a schematic structural view of a main electrode plate according to an embodiment of the present disclosure.

In some embodiments, the main electrode plate 12 of the key of the embodiment includes a first electrode plate and a second electrode plate. As shown in FIG. 6, which is a schematic diagram of the structure of the main electrode plate 12 according to the embodiment, the main electrode plate 12 includes a first electrode plate 121 and a second electrode plate 122. The secondary electrode plate 13, the conductor plate 22 and the first electrode plate 121 form a first capacitor, while the secondary electrode plate 13, the conductor plate 22 and the second electrode plate 122 form a second capacitor. When the core shaft 21 reciprocates, the capacitance signals of the first capacitor and the second capacitor are changed. The detection circuit 20 is connected to the first electrode plate 121 and the second electrode plate 122 of the main electrode plate 12, and the detection circuit 20 is used to detect the first capacitor and the second capacitor.

Because the formula $(C1-C2)/(C1+C2)$ is calculated to obtain $(C1-C2)/(C1+C2)=(S1-S2)/(S1+S2)$, where C1 is the first capacitor, C2 is the second capacitor, S1 is the area of the first electrode 121 facing the conductor plate 22, S2 is the area of the second electrode 122 facing the conductor plate 22, the formula $(C1-C2)/(C1+C2)$ can eliminate the influence of the electrode distance on the capacitance. Therefore, after the detection circuit 20 sends the first capacitance C1 and the second capacitance C2 to the processing unit, the processing unit calculates the value of $(S1-S2)/(S1+S2)$ according to the first capacitance C1 and the second capacitance C2. Based on this value, the key displacement satisfying the value can be determined.

Specifically, the processing unit can pre-store the correspondence between the value of $(S1-S2)/(S1+S2)$ and the key displacement. After the processing unit obtains the first capacitance C1 and the second capacitance C2, the value of the formula $(C1-C2)/(C1+C2)$ can be directly calculated based on the first capacitance C1 and the second capacitance C2, without the need for complex calculations to obtain the value of $(S1-S2)/(S1+S2)$. Then, the key displacement can be directly obtained based on the correspondence between the value of $(S1-S2)/(S1+S2)$ and the key displacement.

Specifically, the main electrode plate 12 includes a first electrode plate 121 and a second electrode plate 122. The first electrode plate 121 and the second electrode plate 122 have a triangular structure, and can be assembled together to form a rectangle. The conductor plate 22 is positioned opposite the first electrode plate 121 and the second electrode plate 122, respectively. The capacitance between the conductor plate 22 and the first electrode plate 121 is denoted as C1, and the capacitance between the conductor plate 22 and the second electrode plate 122 is denoted as C2. Taking the movement of the conductor plate 22 from the bottom up as an example, C1 linearly decreases and C2 linearly increases. The effect of the distance uncertainty between the conductor plate 22 and the main electrode plate 12 can be eliminated using the formula $(C1-C2)/(C1+C2)$.

In some embodiments, the main electrode plate 12 is divided into a first electrode plate 121, a second electrode plate 121, and a third electrode plate 121. This configuration forms a capacitance between the conductor plate 22 and the first electrode plate 121, and a capacitance between the conductor plate 22 and the second electrode plate 122. By performing corresponding relational calculations on these two capacitances, the displacement of the conductor plate 22 (i.e., the key) can be precisely determined, thereby enhancing the accuracy of key detection.

However, during the operation of the key, if the conductor plate 22 undergoes torsion relative to the first electrode plate 121 and the second electrode plate 122, this torsion will cause the equivalent distance between the conductor plate 22 and the first electrode plate 121 to increase, and the equivalent distance between the conductor plate 22 and the second electrode plate 122 decreases. The formula $(C1-C2)/(C1+C2)$ cannot compensate for the effect of the electrode plate spacing, and still using this formula will result in serious errors in the determined displacement of the conductor plate 22, i.e., the key, which may affect the accuracy of button position detection.

Figure 7:
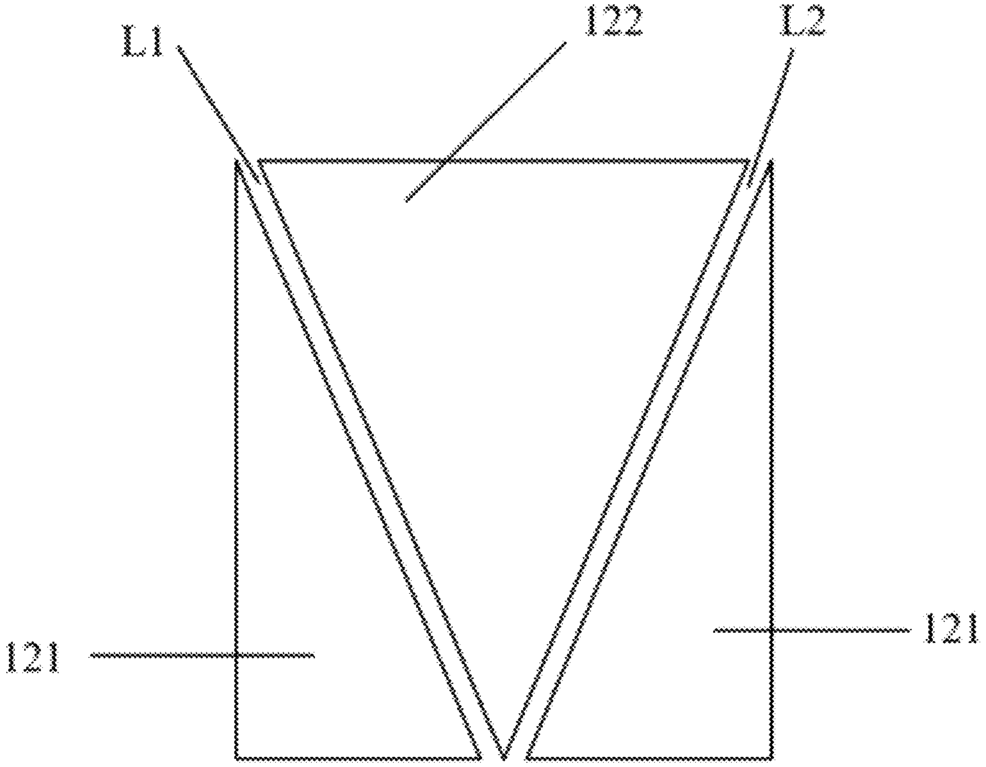
FIG. 7 is a schematic view showing a structure of the main electrode plate according to an embodiment of the present disclosure.

Therefore, in order to solve the problem of poor accuracy in detecting button displacement caused by twisting, in some embodiments, the present disclosure further sets the number of the first electrode plates 121 in the main electrode plate 12 to be two. As shown in FIG. 7, which is a schematic diagram of the structure of the main electrode plate 12 according to some embodiments. The main electrode plate 12 includes two first electrode plates 121 and one second electrode plate 122; the two first electrode plates 121 are symmetrically arranged on both sides of the second electrode plate 122. One of the first electrode plates 121 is separated from the second electrode plate 122 by a first gap, and the other first electrode plate 121 is separated from the second electrode plate 122 by a second gap. The extension directions of the first gap and the second gap each differ from the reciprocating motion direction.

In some embodiments, the keypad is provided with the aforementioned structure. When the key is pressed or released, it causes the conductor plate 22 to twist. The twisting of the conductor plate 22 can cancel out the capacitance generated by the two first electrode plates 121, reducing the change in the first capacitance. The twisting of the conductor plate 22 can also cancel out the capacitance generated by the second electrode plate 122, reducing the change in the second capacitance and thus canceling out the capacitance deviation caused by the twisting of the conductor plate 22. This improves the accuracy of capacitance detection and enhances the accuracy of key position detection.

Specifically, the conductor plate 22, the main electrode plate 12 and the secondary electrode plate 13 form a capacitive structure. As illustrated in the drawings, the conductor plate 22 moves reciprocally up and down. The conductor plate 22 is set with a fixed stroke, and it reciprocates within this fixed stroke along the reciprocating direction. The conductor plate 22 is located on the outer wall of the core shaft 21, while the main electrode plate 12 and the secondary electrode plate 13 are positioned on the inner wall of the casing 11.

Specifically, the main electrode plate 12 includes two first electrode plates 121 and a second electrode plate 122. The two first electrode plates 121 and the second electrode plate 122 are arranged perpendicular to the reciprocating direction and are arranged in the same plane, and the two first electrode plate 121 are symmetrically arranged on both sides of the second electrode plate 122. The secondary electrode plate 13 is fixed opposite to the main electrode plate 12.

In order to cause changes in the capacitance signals of the first capacitor and the second capacitor during the reciprocating motion of the core shaft 21, the length of the first electrode plate 121 in the reciprocating motion direction, and the length of the second electrode plate 122 in the reciprocating motion direction are both greater than the stroke of the conductor plate 22 in the reciprocating motion direction. Thus, it is ensured that during the reciprocating motion of the core shaft 21, the relative area between the conductor plate 22 and the first electrode plate 121 and second electrode plate 122 changes, and the relative area between the conductor plate 22 and the secondary electrode plate 13 changes. Consequently, the capacitance signals of the first capacitor and the second capacitor change. Based on the changes in the first capacitor and the second capacitor, the movement distance of the key can be determined, the intermediate position of the key can be identified, and the accuracy of the key displacement detection is improved.

Specifically, there is a first gap L1 between one of the first electrode plate 121 and the second electrode plate 122, and there is a second gap L2 between the other first electrode plate 121 and the second electrode plate 122. The extension directions of the first gap L1 and the second gap L2 are each different from the reciprocating motion direction.

Specifically, in some embodiments, the two first electrode plates 121 have the same size and shape, and are symmetrically arranged at the two sides of the second electrode plate 122, and are symmetrically arranged along the central axis of the second electrode plate 122. Therefore, the shapes and sizes of the first gap L1 between the first electrode plate 121 and the second electrode plate 122 and the second gap L2 between the other first electrode plate 121 and the second electrode plate 122 are also the same. The first gap L1 and the second gap L2 are symmetrically formed about the central axis of the second electrode plate 122. and the direction of the central axis of the second electrode plate 122 is the same as the reciprocating direction of the core shaft 21.

Specifically, the extension directions of the first gap L1 and the second gap L2 are each different from the reciprocating direction of the core shaft 21. That is, the first gap L1 forms an angle with the reciprocating motion direction of the core shaft 21, while the second gap L2 also forms a symmetrical angle with the reciprocating motion direction of the core shaft 21. When the conductor plate 22 reciprocates with the core shaft 21, the capacitance of both of the first capacitor and the second capacitor changes. Based on the capacitance changes in the first capacitor and the second capacitor, the displacement of the conductor plate 22 can be determined, thereby determining the displacement of the key.

Figure 8:
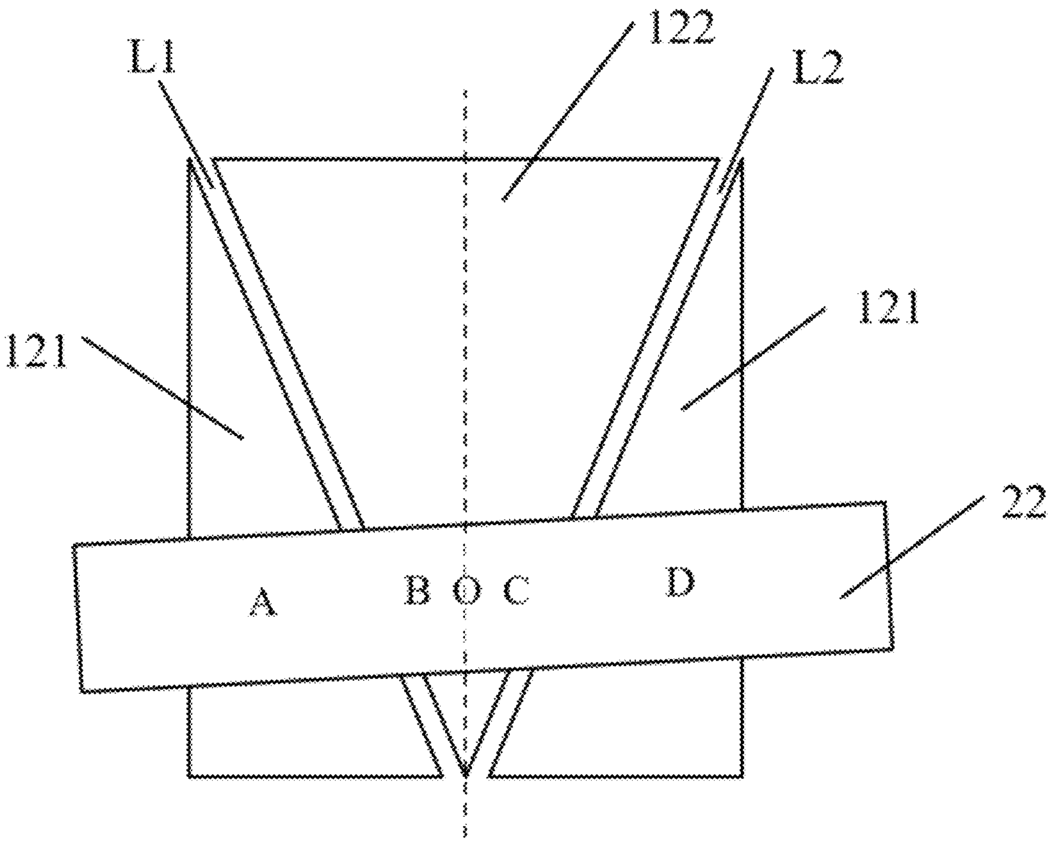
FIG. 8 is a schematic diagram showing a structure of the capacitive structure when undergoing torsion according to an embodiment of the present disclosure.

As shown in FIG. 8, which is a schematic diagram of the capacitor structure according to some embodiments when it undergoes torsion. The dashed line represents the central axis of the second electrode plate 122, and the conductor plate 22 rotates around the dashed line as the axis. When the conductor plate 22 is twisted with the movement of the core shaft 21, the distance between the A and the first electrode plate 121 is large. The distances from the main electrode plate 12 to points A, B, C, and D on the conductor plate 22 are, in sequence, large, less than large, greater than small, and small. Both points A and D face the first electrode plate 121, so the effects of torsion cancel each other out. Similarly, the effects of torsion at points B and C also cancel each other out. Moreover, it can be approximated that the equivalent distance between the two first electrode plates 121 and the conductor plate 22, and the equivalent distance between the second electrode plate 122 and the conductor plate 22, are both equal to the equivalent distance between point O on the central axis and the conductor plate 22. This compensates for the effects of torsion, improves the accuracy of capacitance detection, and ultimately enhances the accuracy of detecting key displacement.

Specifically, two first electrode plates 121 and the second electrode plate 122 together form a rectangular prism. The length of the first gap L1 and the second gap L2 in the reciprocating direction of the core shaft 21 is equal to the length of the electrode plate assembly in the reciprocating direction of the core shaft 21. The lengths of the first gap L1 and the second gap L2 in the target direction is equal to a half of the width of the electrode plate assembly in the target direction. The target direction is a direction perpendicular to the reciprocating direction of the core shaft 21 and parallel to the surface of the main electrode plate 12 close to the conductor plate.

In some embodiments, in the electrode plate assembly, the extension direction of the first gap L1 and the second gap L2 is a straight line as shown in FIG. 7. From bottom to top, the distance between the first gap L1 and the second gap L2 increases linearly, and the gap between the first gap L1 and the second gap L2 forms a V-shape. Specifically, the first gap L1 extends linearly from the midpoint of the bottom edge of the rectangular prism to the left vertex of the rectangular prism, and the second gap L2 extends linearly from the midpoint of the bottom edge of the rectangular prism to the right vertex of the rectangular prism. In some embodiments, the extension direction of the first gap L1 and the second gap L2 is set as a straight line, so that when the conductor plate 22 moves back and forth with the core shaft 21 in the reciprocating direction, the area of the conductor plate 22 facing the first electrode plate 121 and the second electrode plate 122 shows a linear trend, while the change in the formula (C1−C2)/(C1+C2) is only related to the change in the facing area. By using the formula (C1−C2)/(C1+C2), not only can the influence of the electrode spacing be eliminated, but also a linear trend can be observed with the change in the facing area, thereby further improving the accuracy of capacitance detection and further enhancing the accuracy of key position detection.

In some other embodiments, the extension direction of the first gap L1 and the second gap L2 can be curves, the reciprocating motion direction is from bottom to top. The distance between the first gap L1 and the second gap L2 only needs to gradually increase, for example, the first gap L1 and the second gap L2 may form a U-shape.

Specifically, in the case where a small twist occurs, that is, when the twisting distance of the conductor plate 22 is significantly less than the distance between the electrode plates, the formula (C1−C2)/(C1+C2) is close to the case where no twisting occurs. The effect of the torsion of the conductor plate 22 on the formula (C1−C2)/(C1+C2) can be negligible. Therefore, with the aforementioned key structure, even when the conductor plate 22 undergoes a small amount of twisting, the formula (C1−C2)/(C1+C2) can still compensate for the influence of the electrode spacing. This enhances the precision of capacitance detection, thereby improving the accuracy of key position detection.

However, when the twisting distance of the conductor plate 22 is relatively large, the accuracy of using only two first plates 121 and one second plate 122 will also decrease, and there may be some situations that cannot be fully compensated. Therefore, in order to solve the problem of low accuracy of key detection caused by large torsion and further improve the accuracy of key displacement detection, the two first electrode plates 121 and one second electrode plate 122 are formed into an electrode plate assembly. The main electrode plate 12 may include a plurality of electrode plate assemblies.

Figure 9:
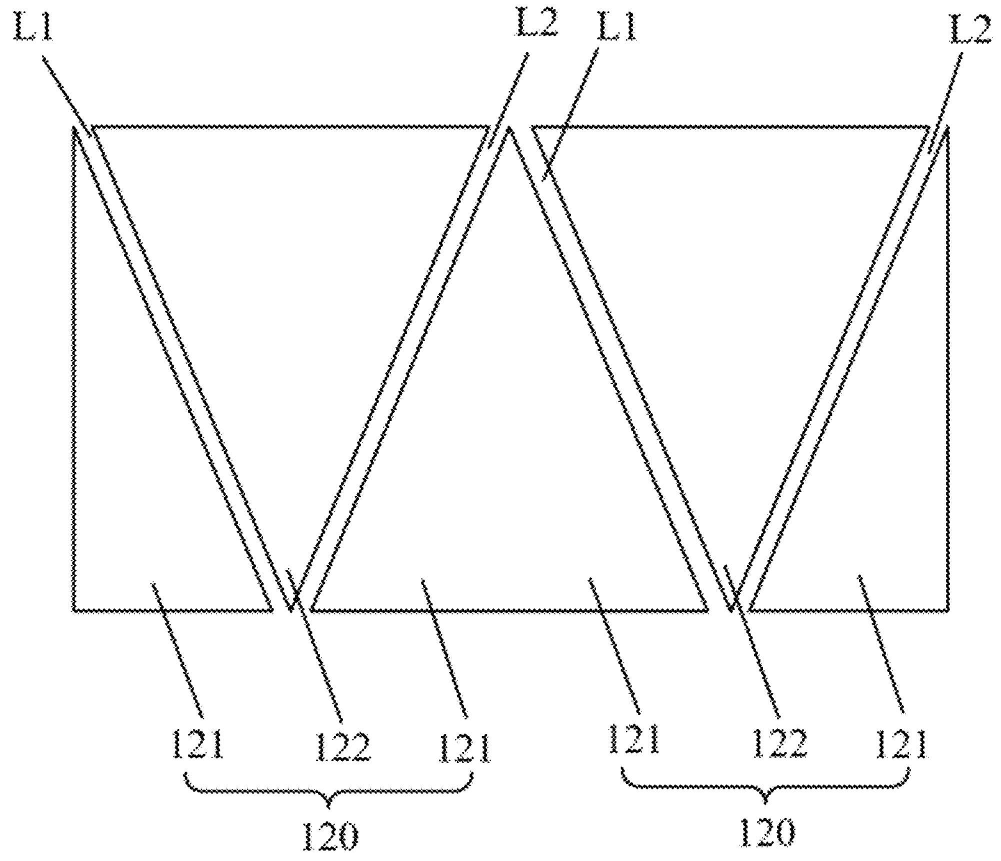
FIG. 9 is a schematic view showing a structure of the main electrode plate according to an embodiment of the present disclosure.

As shown in FIG. 9, which is a schematic diagram of the structure of the main electrode plate 12 according to some embodiments. The main electrode plate 12 includes a plurality of electrode plate assemblies 120. The plurality of electrode plate assemblies 120 are arranged on the inner wall of the casing, and are arranged along a direction perpendicular to the reciprocating motion direction. A first electrode plate 121 of a respective electrode plate assembly 120 of the plurality of electrode plate assemblies 120 is arranged adjacent to and is integrated with a first electrode plate 121 of a corresponding electrode plate assembly 120 adjacent to the respective electrode plate assembly.

A structure with multiple electrode plate assemblies 120 arranged within the main electrode plate 12 is used. Given the fixed internal space of the key, this allows for the maximum possible number of the electrode plate assemblies 120 to be installed, with each assembly occupying the smallest possible space in its arrangement direction. In the event of conductor plate 22 twisting, the relative twist between the conductor plate 22 and each electrode plate assembly 120 is significantly reduced compared to the overall twist. This further eliminates capacitance deviation caused by the twist between conductor plate 22 and each electrode plate assembly 120, thereby enhancing the overall accuracy of capacitance detection and improving position detection accuracy. It should be noted that as the number of electrode plate assemblies 120 increases, the conductor plate 22 approaches a more parallel state relative to each electrode plate assembly 120, resulting in better elimination of capacitance deviation caused by torsion and higher accuracy in detecting key displacement.

Specifically, the first electrode plates 121 and the second electrode plates 122 are arranged in a staggered and alternating manner so as to counteract the torsion influence of the core shaft 21. The extension direction of the first gap L1 and the second gap L2 is a straight line, under the condition that there are multiple electrode plate assemblies 120, the multiple first gaps L1 and the multiple second gaps L2 form W-shape. The W-shaped main electrode plate 12 can further improve the compensation effect. By setting the extension directions of the first gaps L1 and the second gaps L2 as straight lines, and providing a W-shaped main electrode plate 12, when the conductor board 22 moves in the reciprocating direction, the facing area between the conductor plate 22 and the first electrode plate 121, and the facing area between the conductor plate 22 and the second electrode plate 122 can be changed linearly. The setting of multiple electrode plate assemblies 120 offsets the effect of torsion on capacitance. The change in the formula (C1−C2)/(C1+C2) is only related to the change in facing area as much as possible, so that the formula (C1−C2)/(C1+C2) shows a linear change trend with the change in facing area, thereby further improving the accuracy of capacitance detection and further improving the accuracy of key displacement detection.

It can be seen that in three structures of the main electrode plate 12 as shown in FIG. 6, FIG. 7 and FIG. 9, the main electrode plate 12 is divided into two types of electrode plates, namely the first electrode plate 121, and a second electrode plate 122. The first electrode plates 121 of each column of keys is connected to a respective first detection pin of the detection circuit 20, and the second electrode plates 122 of each column of keys is connected to a respective second detection pin of the detection circuit 20. Therefore, when the detection circuit 20 detects one key, two capacitance signals of the capacitors are obtained, namely the capacitance signal of the first capacitor and the capacitance signal of the second capacitor, so as to determine the pressing status of the key through the first capacitor and the second capacitor and improving the accuracy of the key detection.

Figure 10:
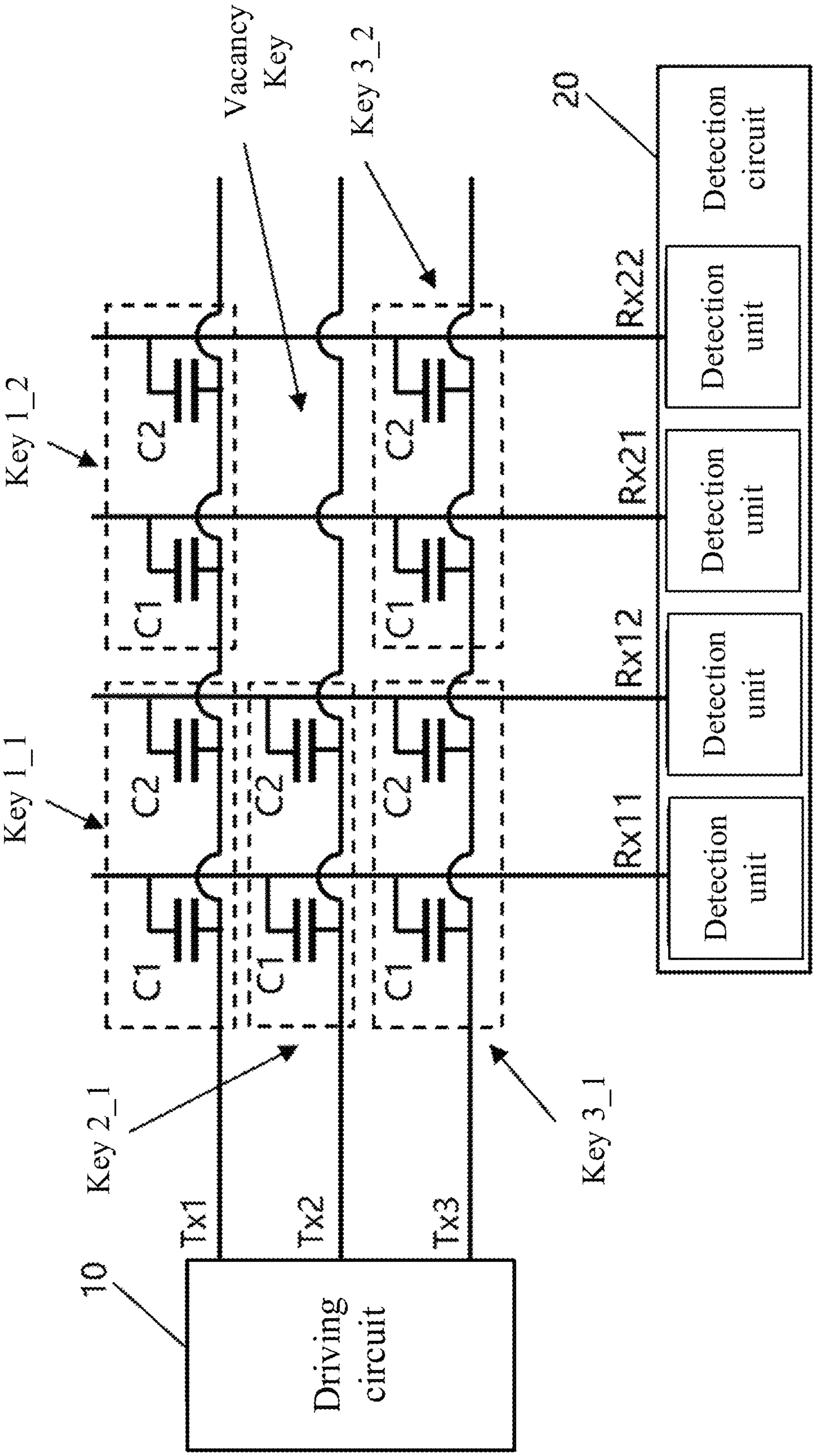
FIG. 10 is a schematic diagram of an equivalent circuit of a key pressing detection system according to an embodiment of the present disclosure.

As shown in FIG. 10, which shows an equivalent circuit diagram of the key detection system according to some embodiments of the present disclosure. In the embodiment, the key detection system includes a driving circuit 10, a detection circuit 20 and a plurality of keys. The plurality of keys are arranged in an N*M matrix, where N and M are integers greater than 0. The driving circuit 10 includes N driving pins, i.e., Tx1, Tx2, Tx3, . . . , TxN, and the detection circuit 20 includes M first detection pins, and M second detection pins. The first detection pins include pins Rx11, Rx21, Rx31, . . . , RxM1, and the second detection pins include pins Rx12, Rx22, Rx32, . . . , RxM2. In FIG. 10, N is represented as 3 and M is represented as 2. In order to meet the practical requirements, the keypad may include one or more vacancy keys; however, these vacancy keys do not affect the implementation of the embodiments and still satisfy the key detection requirements.

Specifically, the dashed-line box in FIG. 10 represents a key, the capacitor C1 within the dashed-line box denotes the first capacitor formed by the conductor plate 22, the secondary electrode plate 13 and the first electrode plate 121 of the main electrode plate 12. The capacitor C2 within the box denotes the first capacitor formed by the conductor plate 22, the secondary electrode plate 13, and the second electrode plate 122 of the main electrode plate 12. In some embodiments, the keys are arranged in a row and column sequence. The secondary electrode plate 13 of each row of keys is commonly connected with one driving pin of the driving circuit 10, the first electrode plate 121 of the main electrode plate 12 of each row of keys is commonly connected with one first detecting pin of the detection circuit 20, and the second electrode plate 122 of the main electrode plate 12 of each column of keys is commonly connected to a second detection pin of the detection circuit 20.

In some embodiments, the driving pin Tx1 of the driving circuit 10 connects to the secondary electrode plate 13 of key 1_1 and key 1_2. The driving pin Tx2 of the driving circuit 10 connects to the secondary electrode plate 13 of the key 2_1. The driving pin Tx3 of the driving circuit 10 connects to the secondary electrode plate 13 of key 3_1 and the key 3_2. The first detection pin Rx11 of the detection circuit 20 connects to the first electrode plate 121 of the main electrode plate 12 of key 1_1, the key 2_1, and key 3_1. The second detection pin Rx12 of the detection circuit 20 connects to the second electrode plate 122 of the main electrode plate 12 of key 1_1, key 2_1 and key 3_1. The first detection pin Rx21 of the detection circuit 20 connects to the first electrode plate 121 of the main electrode plate 12 of key 1_2 and key 3_2. The second detection pin Rx22 of the detection circuit 20 connects to the second electrode plate 122 of the main electrode plate 12 of key 1_2 and key 3_2.

Specifically, each detection circuit 20 includes a plurality of detection units, where each of the detection units is connected to a respective first detection pin or a respective second detection pin, and each of the detection units is configured to acquire a first capacitance signal of the first capacitor or a second capacitance signal of the second capacitor, thereby realizing detection of the capacitance signals of the capacitors. The first detection pins and the second detection pins are arranged in a staggered and alternating manner. The first electrode plate 121 and the second electrode plate 122 of the main electrode plate 12 of the same key are connected to the adjacent first detection pins and the second detection pins. That is, the first detection pins and the second detecting pins adjacent to the detection circuit 20 can acquire the first capacitance signal and the second capacitance signal of the same key, which is convenient for obtaining the capacitance signal and calculating the key displacement.

Specifically, when the driving circuit 10 activates the secondary electrode plates 13 via the driving pins, the secondary electrode plate 13 may operate simultaneously or in a time-division manner. That is, the detection circuit 20 receives signals in real time, and the driving circuit 10 may perform a time-division sweeping operation or a simultaneous sweeping operation.

Taking the time-division sweeping operation as an example to illustrate, the driving circuit 10 sends the driving signals in a time-division manner. When the driving circuit 10 sends a driving signal through the driving pin Tx1, the secondary electrode plate 13 of keys 1_1 and key 1_2 in the first row starts to operate, while keys in other rows remain inactive. The first detection pins Rx11 and Rx21 of the detection circuit 20 respectively receive the capacitance signals from the first capacitors of key 1_1 and key 1_2. The second detection pins Rx12 and Rx22 of detection circuit 20 respectively receive the capacitance signals from the second capacitors of key 1_1 and key 1_2. If key 1_1 is pressed at this moment, the capacitance signal received by the first detection pin Rx11 of detection circuit 20 from the first capacitor changes, and the capacitance signal received by the second detection pin Rx12 of detection circuit 20 for the second capacitor also changes. Based on the changes in both capacitors, it can be determined that key 1_1 has been pressed and the pressed displacement of key 1_1. The process for key 1_2 is similar and will not be repeated here. Through this method, the press status of all keys in the first row is obtained, thereby determining a corresponding user indication. Subsequently, the drive pin Tx1 of the driving circuit 10 ceases signal transmission. The driving circuit 10 then sends the driving signal via the drive pin Tx2, and so on, until the entire sweeping process is completed. In the overall circuit layout, gaps are permitted and do not affect detection performance.

The capacitive information is obtained through the aforementioned circuit structure, and the capacitive data is processed to determine the current real-time displacement of the key. At a given moment, if the displacement exceeds a certain threshold, a specific action may be triggered based on the settings. a specific action can be triggered according to preset parameters. For example, a key may have a two-stage trigger scenario: during typing, for the A key, no action occurs when displacement is 0; displacement between 0.5 mm and 2 mm triggers lowercase “a”, exceeding 2 mm triggers uppercase“A”. Furthermore, multi-stage triggering may be applied in additional scenarios. For instance, if the A key is designed as an accelerator key in a game, deeper presses correspond to pressing the accelerator harder, with a full press equating to flooring the accelerator. Due to the high linearity and resolution of capacitive key detection, the process of pressing the accelerator can be accurately simulated, thereby enhancing the user experience.

Specifically, only a portion of the keys on a full keyboard can utilize the aforementioned capacitive keys. For example, special keys in the keyboard can use capacitive switches, while other positions can be replaced with conventional mechanical switches, requiring only corresponding adjustments in both circuitry and software. For each capacitive key, parameters such as trigger thresholds and functions can be independently configured, enhancing the flexibility of key operations.

Specifically, for high-performance capacitor detection chips, such as CHCT5562 chip, a complete sweeping cycle can be completed within 10 ms. Consequently, each capacitive key can achieve a polling rate exceeding 100 Hz. If it is necessary to further improve the reporting rate, the simultaneous sweeping operation can also be used.

A circuit connection that aligns the overall circuit layout with the key structure arrangement is used. The secondary electrode plates 13 of each row of keys share a respective drive pin. The first electrode plates 121 of main electrode plates 12 of each column of keys share a respective first detection pin. The second electrode plates 122 of main electrode plates 12 of each column of keys shares a respective second detection pin. This not only simplifies circuit complexity but also reduces circuit costs. Meanwhile, the displacement of a key is determined through the first capacitor and the second capacitor, thereby improving the accuracy of the key displacement detection.

Specifically, the capacitive sensing key further includes a shaft seat 3, the main electrode plate 12 includes a first pin pin1, a second pin pin2, and a ground pin GND, and the secondary electrode plate 13 includes a third pin pin3. The first pin pin1, the second pin pin2, the third pin pin3, and the ground pin GND penetrate the bottom of the casing 11 and are connected to the corresponding interface on the shaft seat 3. The movement assembly 2 further includes a cover plate 23 having a hollow area. The cover plate 23 covers the core shaft 21, and the top surface of the core shaft 21 is exposed out of the surface of the cover plate 23 through the hollow area.

Figure 11:
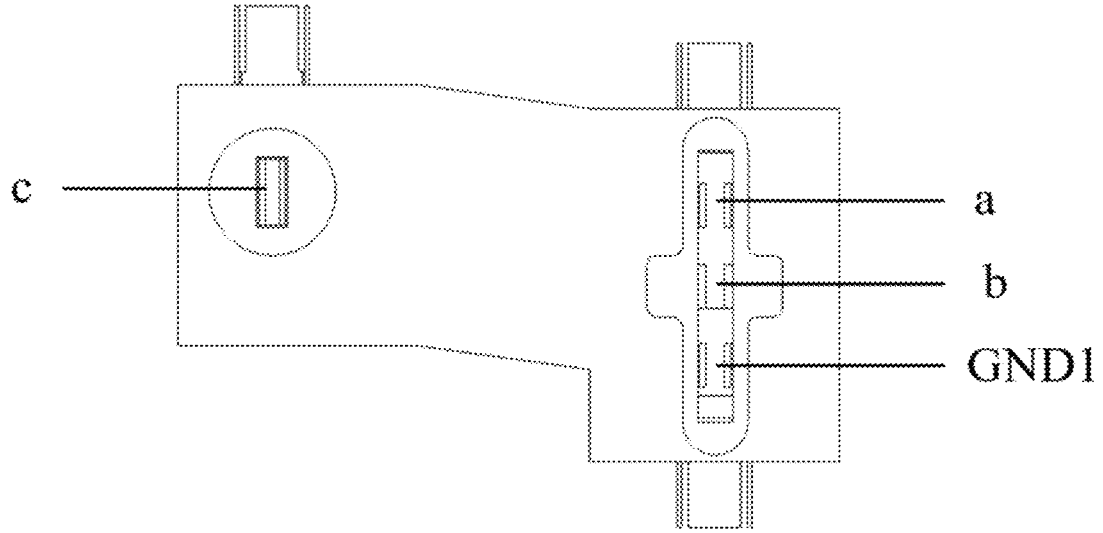
FIG. 11 is a schematic diagram of a structure of a shaft seat of the capacitive sensing key corresponding to FIG. 1 according to an embodiment of the present disclosure.
Figure 12:
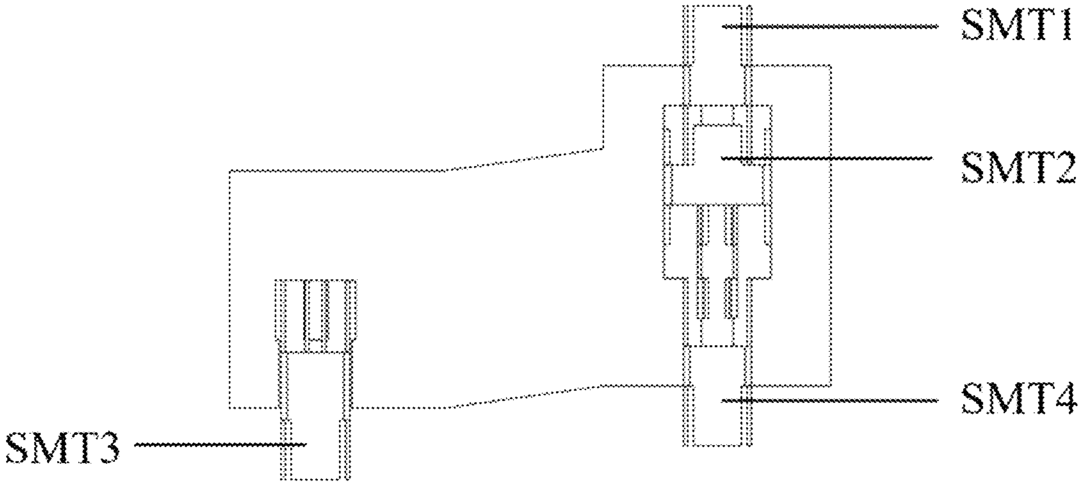
FIG. 12 is a schematic diagram of a structure of an SMT chip encapsulated by the shaft seat of a capacitive sensing key corresponding to FIG. 1 according to an embodiment of the present disclosure.
Figure 13:
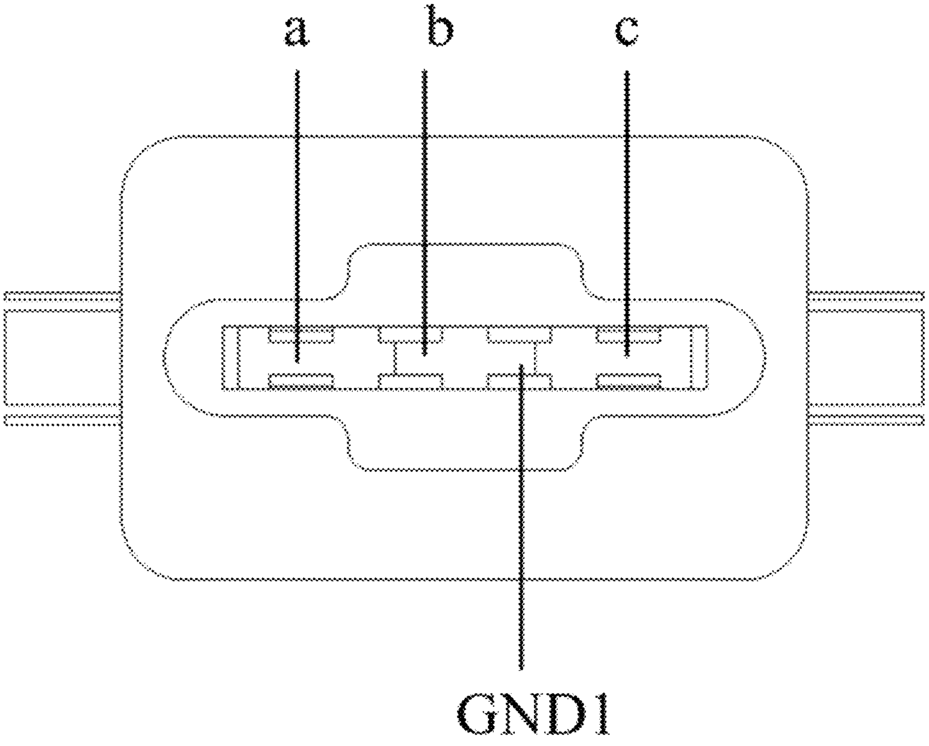
FIG. 13 is a schematic diagram of a structure of a shaft seat of the capacitive sensing key corresponding to FIG. 3 according to an embodiment of the present disclosure.
Figure 14:
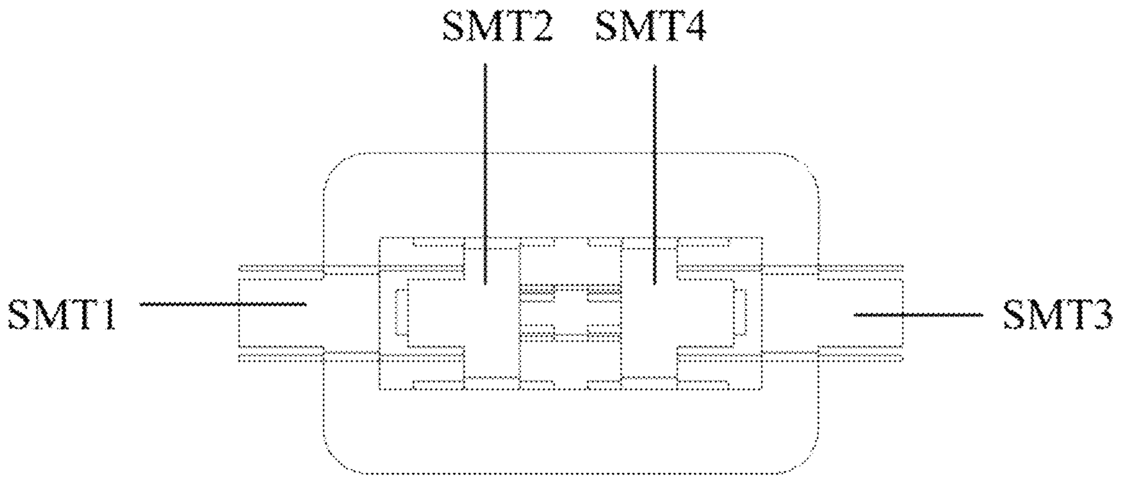
FIG. 14 is a schematic diagram of the shaft seat of the capacitive sensing key corresponding to FIG. 3 encapsulating the SMT chip according to an embodiments of the present disclosure.

Specifically, the shaft seat 3 includes a first interface, a second interface, and a third interface, as shown in FIG. 11, which is a schematic diagram of the structure of the shaft seat 3 in the capacitive sensing key corresponding to FIG. 1. As shown in FIG. 12, which is a schematic diagram of the structure of the SMT chip encapsulated by the shaft seat 3 of the capacitive sensing key corresponding to FIG. 1. As shown in FIG. 13, which is a schematic diagram of the structure of the shaft seat 3 of the capacitive sensing key corresponding to FIG. 3, and as shown in FIG. 14, which is a schematic diagram of the structure of the shaft seat 3 of the capacitive sensing key corresponding to FIG. 3 encapsulating the SMT chip.

Specifically, the shaft seat 3 includes a first interface a, a second interface b, and a third interface c. The first electrode plate 121 and the second electrode plate 122 of the secondary electrode plate 13 and the main electrode plate 12 are fixed to the casing 11 by glue or buckles. The bottom pin positions of the secondary electrode plate 13, the first electrode plate 121, and the second electrode plate 122 extend out of the casing 11 for subsequent connection with the shaft seat 3. The plurality of first plates 121 share a first pin pin1, the plurality of second plates 122 share a second pin pin2, and the secondary electrode plate 13 has a third pin pin3.

As shown in FIG. 1 and FIG. 3, in the two capacitive sensing keys, it can be seen that the main electrode plate 12 includes a first pin pin1, and the second pin pin2, and the secondary electrode plate 13 includes a third pin pin3. The first interface a is connected to the first pin pin1, the first pin pin1 is connected to each first plate 121 in the main electrode plate 12. The second interface b is connected to the second pin pin2, and the second pin pin2 is connected to each of the second electrode plates 122 in the main electrode plate 12. The third interface c is connected to the third pin pin3.

Specifically, the entire back surface of the main electrode plate 12 is fully grounded, that is, the side of the main electrode plate 12 facing away from the conductor plate 22 is fully grounded to shield interference signals. Therefore, the main electrode plate 12 also includes a grounding pin GND, and the corresponding shaft seat 3 also includes a grounding port GND1. The grounding pin GND of the main electrode plate 12 is connected to the grounding port GND1 on the shaft seat 3. The shaft seat 3 is equipped with multiple surface mount technology (SMT) pads, which connect to the first interface a, second interface b, third interface c, and ground port GND1 respectively. Specifically, pad SMT1 connects to the first interface a, pad SMT2 connects to the second interface b, pad SMT3 connects to the third interface c, and pad SMT4 connects to the ground port GND1.

Specifically, the positions of the plurality of interfaces on the shaft seat 3 correspond to the positions of pins of the main electrode plate 12 and the secondary electrode plate 13. The plurality of interfaces on the shaft seat 3, such as the interface of the shaft seat in FIG. 1 corresponding to the SMT pad in FIG. 11, and FIG. 12, and the interface of the shaft seat 3 in FIG. 3 corresponding to the SMT pad in FIG. 13 and FIG. 14, can be set according to the pin positions of the main electrode plate 12 and the secondary electrode plate 13 in practice, so that the pins of the main electrode plate 12 and the secondary electrode plate 13 penetrate the casing 11 and are directly connected to the corresponding interfaces on the shaft seat 3, minimizing the length of the pins and reducing the size of the keys.

Specifically, the shaft seat 3 is fixed to the main circuit board by SMT technology. After the conductive pins at the bottom of the main electrode plate 12 and the secondary electrode plate 13 are inserted into the shaft seat 3, they are connected to the main circuit board through the contact between the pins to form a capacitor loop, which facilitates the detection of changes in the first capacitor and the second capacitor, thereby achieving the detection of key displacement. This solution is simple, reliable, cost-effective, and can achieve hot plugging function.

Specifically, the conductor plate 22 is generally made of conductive metal, and the conductor plate 22 is fixed on the core shaft 21 to form an integrated structure and moves up and down along with the pressing of the core shaft 21. The secondary electrode plate 13 may be manufactured by metal stamping. The main electrode plate 12 may be fabricated using a PCB board, or alternatively using an FPC or a metal sheet.

Figure 15:
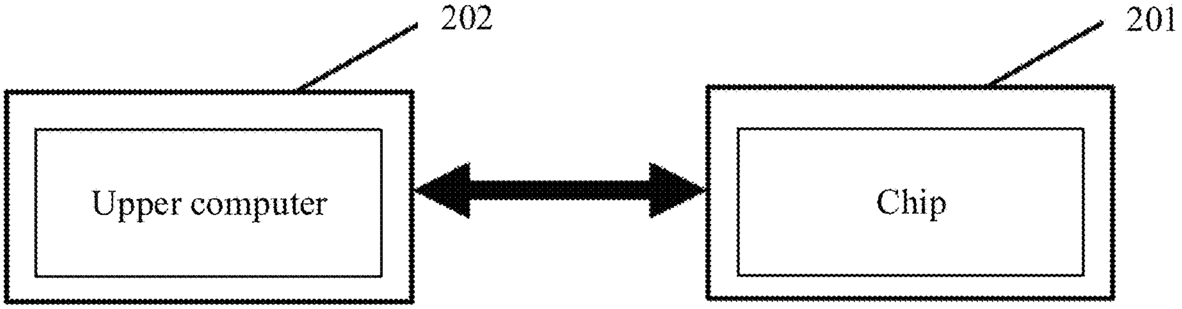
FIG. 15 is a schematic diagram of a connection between a CHCT5562 chip and an upper computer according to an embodiment of the present disclosure.

In some embodiments, the driving circuit 10 and detection circuit 20 of the key detection system may be provided in a single chip. FIG. 15 illustrates a schematic diagram of a connection between a chip and an upper computer. The chip 201 and the upper computer 202 are connected through an interface, and the interface can be General Purpose Input Output (GPIO), Inter-Integrated Circuit (I2C), Improved Inter-Integrated Circuit (I3C), or Serial Peripheral Interface (SPI).

Specifically, the chip 201 can be a CHCT5562 chip, and the CHCT5562 chip provides the driving pins and the detection pins for the driving circuit. The CHCT5562 chip is connected to the upper computer 202 for control and computation. The upper computer 202 can be a main control chip of the keyboard, and the CHCT5562 chip transmits the current pressing status of all keys to the upper computer 202 for subsequent processing, including determining the keys and the pressing displacement of the keys according to the capacitance.

Figure 16:
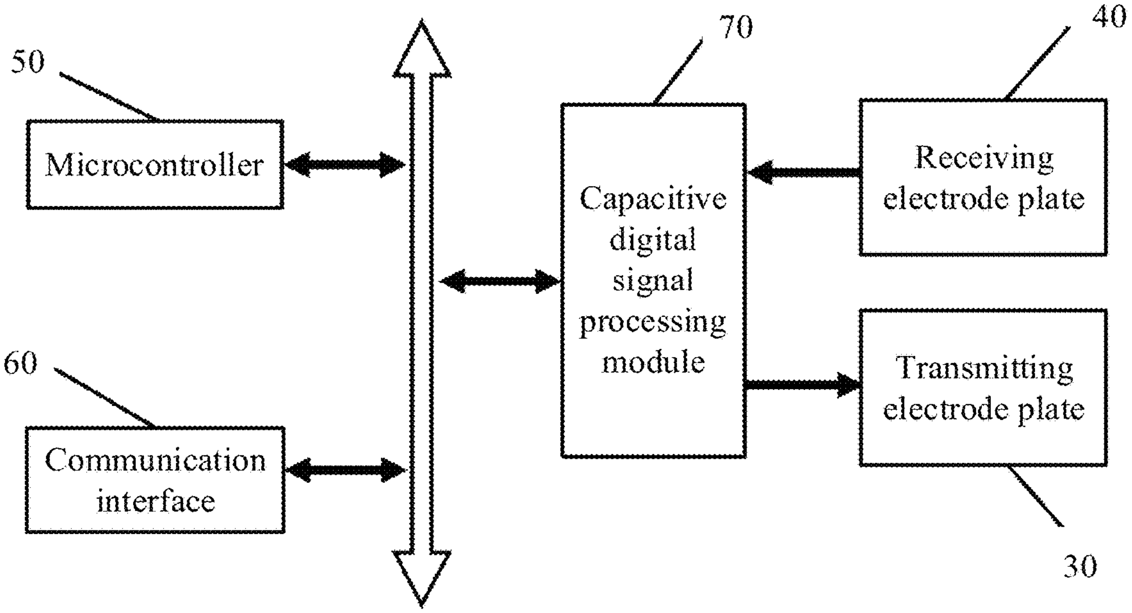
FIG. 16 is a structural diagram of a CHCT5562 chip according to an embodiment of the present disclosure.

Specifically, because the CHCT5562 chip itself has a microprocessor (MCU, Micro Controller Unit) and a plurality of communication interfaces, it can serve as an upper computer to control other chips, and it itself can serve as both a main control chip and a capacitor detection chip, thereby reducing cost. FIG. 16 shows a schematic diagram of a structure of the CHCT5562 chip, including a microcontroller 50, a communication interface 60, and a capacitive digital signal processing module 70.

Specifically, the CHCT5562 chip is provided with 20 numbers of drive pins and 42 numbers of detection pins, and is a high-performance capacitor detection chip. Therefore, only one CHCT5562 chip is needed to implement the key detection of the full keyboard. Moreover, according to the detection principle, the status of all keys can be measured, processed, and displayed in real time, inherently achieving full key rollover without requiring additional processing.

In some embodiments, taking the CHCT5562 chip as both the main control chip and the capacitor detection chip, and additionally controlling light emitting diode (LED) as an example. The transmitting electrode plate 30 transmits specific voltage and current signals, which are controlled by the capacitive digital signal processing module 70. After the receiving electrode plate 40 receives electrical signals, the capacitive digital signal processing module 70 processes the electrical signals and sends to the microcontroller 50 to determine which keys are pressed at this time. Assuming that the "A" key is pressed at this time, the information is transmitted to an upper computer such as a host computer through the communication interface 60, and the upper computer performs corresponding actions, such as typing the letter "A". Simultaneously, when the "A" key is pressed, the information is processed by the microcontroller 50 and then transmitted to the LED control chip through the communication interface 60. After the LED control chip receives the signal, the LED control chip controls the LED corresponding to the "A" key to illuminate. It should be noted that the transmitting electrode plate 30 is the secondary electrode plate 13, and the receiving electrode plate 40 is the first electrode plate 121 or the second electrode plate 122 of the main electrode plate 12 in the embodiment.

On the other hand, some embodiments of the present disclosure further provide an electronic device including the above-mentioned key pressing detection system.

Compared with the related technologies, the electronic device provided in some embodiments of the present disclosure is equipped with the key pressing detection system as described in the previous embodiments. Consequently, it similarly achieves the technical effects described in those embodiments and will not be repeated here.

The division of the various components above is solely for descriptive purposes. During implementation, they can be combined into a single component or certain components may be split into multiple components. As long as they encompass the same logical relationships, they remain within the scope of the embodiments.

Some embodiment of the present disclosure provide a key detection method applied to the above-mentioned key detection system, the method including: detecting a capacitance signal generated by a target capacitor of the at least key; and determining a pressing status of the at least key based on changes in the capacitance signal.

Specifically, the pressing status of the key includes determining whether the key is pressed and the displacement of the pressed key. The movement distance of the key is determined based on the changes in the capacitance signal detected from the target capacitor, which has been described in detail in the above embodiments and will not be repeated here.

The division of steps in the various methods above is solely for descriptive purposes. During implementation, steps may be combined into a single step or certain steps may be split into multiple steps. As long as the same logical relationships are maintained, they remain within the scope of protection of the present disclosure. Minor modifications to the algorithm or process, or the introduction of minor design elements that do not alter the core design of the algorithm or process, also fall within the scope of protection of the present disclosure.

Some embodiments of the present disclosure provide a non-transitory computer-readable storage medium storing a computer program, when executed by a processor, the computer program implements the method embodiments described above.

That is, it can be understood by those skilled in the art that implementing all or part of the steps in the above implementation methods can be accomplished through a program that instructs relevant hardware. The program is stored in a storage medium and includes several instructions to enable a device (such as a microcontroller, chip, etc.) or a processor to execute all or part of the steps in the various implementation methods of the present disclosure. The aforementioned storage media include various media that can store program code, such as USB flash drives, portable hard drives, read-only memory (ROM), random access memory (RAM), magnetic disks, or optical disks.

It will be understood by those skilled in the art that the above embodiments are specific implementations for carrying out the present disclosure, and in practical applications, various modifications may be made in form and details without departing from the spirit and scope of the present disclosure.

What is claimed is:

1. A key pressing detection system, comprising:

at least one key, a driving circuit, a detection circuit, and a processing unit;

each of the at least one key comprising a base and a movement assembly, the movement assembly extending through a top surface of the base and configured to reciprocate in a first direction perpendicular to the top surface, and the movement assembly comprising a core shaft, and two conductor plates opposite to the core shaft and fixed relative to the core shaft;

the base comprising a casing, a main electrode plate, and a secondary electrode plate both fixed relative to the casing, the two conductor plates being arranged opposite to the main electrode plate and to the secondary electrode plate, the secondary electrode plate, the two conductor plates, and the main electrode plate forming a target capacitor configured to generate capacitance signals that change in response to the core shaft reciprocating;

wherein the driving circuit is connected to the secondary electrode plate and configured to drive the secondary electrode plate, and the detection circuit is connected to the main electrode plate and configured to detect the capacitance signals of the target capacitor;

wherein the processing unit is connected to the detection circuit and configured to determine a displacement of the at least one key according to the capacitance signals of the target capacitor;

wherein each of the two conductor plates is arranged on a respective outer side wall of the core shaft, and the two conductor plates are connected to each other by wires;

wherein each of the secondary electrode plate and the main electrode plate is arranged on a respective inner side wall of the casing, the secondary electrode plate is arranged opposite to one of the two conductor plates, and the main electrode plate is arranged opposite to the other one of the two conductor plates;

wherein the main electrode plate comprises at least one first electrode plate and a second electrode plate, the secondary electrode plate, the two conductor plates, and the at least one first electrode plate form a first capacitor, and the secondary electrode plate, the two conductor plates, and the second electrode plate form a second capacitor;

the detection circuit is connected to the at least one first electrode plate and the second electrode plate of the main electrode plate, and the detection circuit is configured to detect a capacitance signal of the first capacitor and a capacitance signal of the second capacitor;

the capacitance signal of the first capacitor and the capacitance signal of the second capacitor are changed when the core shaft reciprocates; and the at least one first electrode plate comprises two first electrode plates symmetrically arranged on both sides of the second electrode plate, one of the two first electrode plates is separated from the second electrode plate by a first gap, the other one of the two first electrode plates is separated from the second electrode plate by a second gap, and each of the first gap and the second gap extends in a second direction that is different from the first direction.

2. The key pressing detection system according to claim 1, wherein the at least one key includes a plurality of keys, the plurality of keys are arranged in a matrix having N rows and M columns, wherein N and M are integers greater than 0, the driving circuit comprises N driving pins; and the secondary electrode plate of each key of each of the rows is connected to a respective driving pin of the driving circuit.

3. The key pressing detection system according to claim 1, wherein the two first electrode plates and the second electrode plate form an electrode plate assembly, and the main electrode plate comprises a plurality of electrode plate assemblies arranged on an inner side wall of the casing and arranged along a direction perpendicular to a reciprocating motion direction; and wherein a first electrode plate of a respective electrode plate assembly of the plurality of electrode plate assemblies is arranged adjacent to and is integrated with a first electrode plate of a corresponding electrode plate assembly adjacent to the respective electrode plate assembly.

4. The key pressing detection system according to claim 1, wherein the at least one key includes a plurality of keys, the plurality of keys are arranged in a matrix having N rows and M columns, wherein N and M are integers greater than 0, the driving circuit comprises N driving pins, and the detection circuit comprises M first detection pins and M second detection pins;

the secondary electrode plate of each key of each of the rows is connected to a respective driving pin of the driving circuit;

the at least one first electrode plate of the main electrode plate of each key of each of the columns is connected to a respective first detection pin of the detection circuit; and the second electrode plate of the main electrode plate of each key of each of the columns is connected to a respective second detection pin of the detection circuit.

5. An electronic device, comprising a key pressing detection system, wherein the key pressing detection system comprises at least one key, a driving circuit, a detection circuit, and a processing unit;

each of the at least one key comprising a base and a movement assembly, the movement assembly extending through a top surface of the base and configured to reciprocate in a first direction perpendicular to the top surface, and the movement assembly comprising a core shaft and two conductor plates opposite to the core shaft and fixed relative to the core shaft;

the base comprising a casing, a main electrode plate, and a secondary electrode plate both fixed relative to the casing, the two conductor plates being arranged opposite to the main electrode plate and to the secondary electrode plate, the secondary electrode plate, the two conductor plates, and the main electrode plate forming a target capacitor configured to generate capacitance signals that change in response to the core shaft reciprocating;

wherein the driving circuit is connected to the secondary electrode plate and configured to drive the secondary electrode plate, and the detection circuit is connected to the main electrode plate and configured to detect the capacitance signals of the target capacitor;

wherein the processing unit is connected to the detection circuit and configured to determine a displacement of the at least one key according to the capacitance signals of the target capacitor;

wherein each of the two conductor plates is arranged on a respective outer side wall of the core shaft, and the two conductor plates are connected to each other by wires;

wherein each of the secondary electrode plate and the main electrode plate is arranged on a respective inner side wall of the casing, the secondary electrode plate is arranged opposite to one of the two conductor plates, and the main electrode plate is arranged opposite to the other one of the two conductor plates;

wherein the main electrode plate comprises at least one first electrode plate and a second electrode plate, the secondary electrode plate, the two conductor plates, and the at least one first electrode plate form a first capacitor, and the secondary electrode plate, the two conductor plates, and the second electrode plate form a second capacitor;

the detection circuit is connected to the at least one first electrode plate and the second electrode plate of the main electrode plate, and the detection circuit is configured to detect a capacitance signal of the first capacitor and a capacitance signal of the second capacitor;

the capacitance signal of the first capacitor and the capacitance signal of the second capacitor are changed when the core shaft reciprocates; and the at least one first electrode plate comprises two first electrode plates symmetrically arranged on both sides of the second electrode plate, one of the two first electrode plates is separated from the second electrode plate by a first gap, the other one of the two first electrode plates is separated from the second electrode plate by a second gap, and each of the first gap and the second gap extends in a second direction that is different from the first direction.

6. The electronic device according to claim 5, wherein the at least one key includes a plurality of keys, the plurality of keys are arranged in a matrix having N rows and M columns, wherein N and M are integers greater than 0, the driving circuit comprises N driving pins; and the secondary electrode plate of each key of each of the rows is connected to a respective driving pin of the driving circuit.

7. The electronic device according to claim 5, wherein the two first electrode plates and the second electrode plate form an electrode plate assembly, and the main electrode plate comprises a plurality of electrode plate assemblies arranged on an inner side wall of the casing and arranged along a direction vertical to a reciprocating motion direction; and wherein a first electrode plate of a respective electrode plate assembly of the plurality of electrode plate assemblies is arranged adjacent to and is integrated with a first electrode plate of a corresponding electrode plate assembly adjacent to the respective electrode plate assembly.

8. The electronic device according to claim 5, wherein the at least one key is a plurality of keys, the plurality of keys are arranged in a matrix having N rows and M columns, wherein N and M are integers greater than 0, the driving circuit comprises N driving pins, the detection circuit comprises M first detection pins and M second detection pins;

the secondary electrode plate of each key of each of the rows is connected to a respective driving pin of the driving circuit;

the at least one first electrode plate of the main electrode plate of each key of each of the columns is connected to a respective first detection pin of the detection circuit; and the second electrode plate of the main electrode plate of each key of each of the columns is connected to a respective second detection pin of the detection circuit.

9. A key pressing detection method, applicable to a key pressing detection system, wherein the key pressing detection system comprises at least one key, a driving circuit, a detection circuit, and a processing unit;

each of the at least one key comprising a base and a movement assembly, the movement assembly extending through a top surface of the base and configured to reciprocate in a first direction perpendicular to the top surface, and the movement assembly comprising a core shaft, and two conductor plates opposite to the core shaft and fixed relative to the core shaft;

the base comprising a casing, a main electrode plate, and a secondary electrode plate both fixed relative to the casing, the two conductor plates being arranged opposite to the main electrode plate and to the secondary electrode plate, the secondary electrode plate, the two conductor plates, and the main electrode plate forming a target capacitor configured to generate capacitance signals that change in response to the core shaft reciprocating;

wherein the driving circuit is connected to the secondary electrode plate and configured to drive the secondary electrode plate, and the detection circuit is connected to the main electrode plate and configured to detect the capacitance signals of the target capacitor;

wherein the processing unit is connected to the detection circuit and configured to determine a displacement of the at least one key according to the capacitance signals of the target capacitor;

wherein each of the two conductor plates is arranged on a respective outer side wall of the core shaft, and the two conductor plates are connected to each other by wires;

wherein each of the secondary electrode plate and the main electrode plate is arranged on a respective inner side wall of the casing, the secondary electrode plate is arranged opposite to one of the two conductor plates, and the main electrode plate is arranged opposite to the other one of the two conductor plates;

wherein the main electrode plate comprises at least one first electrode plate and a second electrode plate, the secondary electrode plate, the two conductor plates, and the at least one first electrode plate form a first capacitor, and the secondary electrode plate, the two conductor plates, and the second electrode plate form a second capacitor;

the detection circuit is connected to the at least one first electrode plate and the second electrode plate of the main electrode plate, and the detection circuit is configured to detect a capacitance signal of the first capacitor and a capacitance signal of the second capacitor;

the capacitance signal of the first capacitor and the capacitance signal of the second capacitor are changed when the core shaft reciprocates;

the at least one first electrode plate comprises two first electrode plates symmetrically arranged on both sides of the second electrode plate, one of the two first electrode plates is separated from the second electrode plate by a first gap, and the other one of the two first electrode plates is separated from the second electrode plate by a second gap, and each of the first gap and the second gap extends in a second direction that is different from the first direction; and wherein the key pressing detection method comprises:

detecting, by the detection circuit, the capacitance signals generated by the target capacitor; and determining, by the processing unit, a pressing status of the at least one key based on the changes in the capacitance signals.

10. The key pressing detection method according to claim 9, wherein the at least one key includes a plurality of keys, the plurality of keys are arranged in a matrix having N rows and M columns, N and M are integers greater than 0, the driving circuit comprises N driving pins;

the secondary electrode plate of each key of each of the rows is connected to a respective driving pin of the driving circuit.

11. The key pressing detection method according to claim 9, wherein the two first electrode plates and the second electrode plate form an electrode plate assembly, and the main electrode plate comprises a plurality of electrode plate assemblies arranged on an inner side wall of the casing and arranged along a direction perpendicular to a reciprocating motion direction; and wherein a first electrode plate of a respective electrode plate assembly of the plurality of electrode plate assemblies is arranged adjacent to and is integrated with a first electrode plate of a corresponding electrode plate assembly adjacent to the respective electrode plate assembly.

12. The key pressing detection method according to claim 9, wherein the at least one key includes a plurality of keys, the plurality of keys are arranged in a matrix having N rows and M columns, wherein N and M are integers greater than 0, the driving circuit comprises N driving pins, and the detection circuit comprises M first detection pins and M second detection pins;

the secondary electrode plate of each key of each of the rows is connected to a respective driving pin of the driving circuit;

the at least one first electrode plate of the main electrode plate of each key of each of the columns is connected to a respective first detection pin of the detection circuit; and the second electrode plate of the main electrode plate of each key of each of the columns is connected to a respective second detection pin of the detection circuit.

* * * * *